US010062562B2

(12) United States Patent
Noda et al.

(10) Patent No.: US 10,062,562 B2
(45) Date of Patent: Aug. 28, 2018

(54) METHOD OF MANUFACTURING SEMICONDUCTOR DEVICE, SUBSTRATE PROCESSING APPARATUS AND RECORDING MEDIUM

(71) Applicant: HITACHI KOKUSAI ELECTRIC INC., Tokyo (JP)

(72) Inventors: Takaaki Noda, Toyama (JP); Kotaro Konno, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/010,333

(22) Filed: Jan. 29, 2016

(65) Prior Publication Data
US 2016/0225617 A1 Aug. 4, 2016

(30) Foreign Application Priority Data

Jan. 30, 2015 (JP) .................................. 2015-017930

(51) Int. Cl.
*H01L 21/00* (2006.01)
*H01L 21/02* (2006.01)
(Continued)

(52) U.S. Cl.
CPC ........ *H01L 21/02271* (2013.01); *C23C 16/30* (2013.01); *C23C 16/4408* (2013.01);
(Continued)

(58) Field of Classification Search
CPC ......... H01L 21/02271; H01L 21/02112; H01L 21/02126; H01L 21/0214; H01L 21/2164;
(Continued)

(56) References Cited

U.S. PATENT DOCUMENTS 7,790,633 B1 * 9/2010 Tarafdar ............ H01L 21/02164
257/E21.471
7,993,705 B2 * 8/2011 Nodera ............... C23C 16/4404
118/70
(Continued)

FOREIGN PATENT DOCUMENTS

JP 2004-040110 A 2/2004
JP 2007-158066 A 6/2007
(Continued)

OTHER PUBLICATIONS

Japanese Office Action dated Sep. 30, 2015 for Japanese Patent Application No. 2014-025790 [With English Translation].
(Continued)

*Primary Examiner* — Dale E Page
*Assistant Examiner* — Quovaunda V Jefferson
(74) *Attorney, Agent, or Firm* — Volpe and Koenig, P.C.

(57) ABSTRACT

According to the present invention, when a film is formed on a substrate, a film-forming rate or film quality is stabilized. There is provided a method of manufacturing a semiconductor device, including: (a) forming a film on a substrate by supplying at least a gas including hydroxyl group to the substrate in a process chamber while maintaining a temperature of an inside of the process chamber at a first temperature; (b) changing the temperature of the inside of the process chamber from the first temperature to a second temperature higher than the first temperature; and (c) maintaining the temperature of the inside of the process chamber at the second temperature at least in a state that the substrate is not in the process chamber.

18 Claims, 22 Drawing Sheets

(51) Int. Cl.
    *C23C 16/46*         (2006.01)
    *C23C 16/52*         (2006.01)
    *H01L 21/67*         (2006.01)
    *C23C 16/30*         (2006.01)
    *C23C 16/44*         (2006.01)
    *C23C 16/455*       (2006.01)
    *C23C 16/458*       (2006.01)

(52) U.S. Cl.
    CPC .... *C23C 16/4584* (2013.01); *C23C 16/45531* (2013.01); *C23C 16/45534* (2013.01); *C23C 16/45546* (2013.01); *C23C 16/45578* (2013.01); *C23C 16/46* (2013.01); *C23C 16/52* (2013.01); *H01L 21/0214* (2013.01); *H01L 21/02112* (2013.01); *H01L 21/02126* (2013.01); *H01L 21/02164* (2013.01); *H01L 21/02175* (2013.01); *H01L 21/02211* (2013.01); *H01L 21/67109* (2013.01); *H01L 21/67248* (2013.01)

(58) Field of Classification Search
    CPC ......... H01L 21/02175; H01L 21/02211; H01L 21/67109; H01L 21/67248
    See application file for complete search history.

(56) References Cited

U.S. PATENT DOCUMENTS

| | | | |
|---|---|---|---|
| 2003/0097987 A1* | 5/2003 | Fukuda | C23C 16/4405 118/723 E |
| 2004/0018694 A1* | 1/2004 | Lee | C23C 16/402 438/400 |
| 2014/0287596 A1 | 9/2014 | Hirose et al. | |
| 2014/0295082 A1 | 10/2014 | Motoyama et al. | |

FOREIGN PATENT DOCUMENTS

| | | |
|---|---|---|
| JP | 2014-183218 A | 9/2014 |
| JP | 2014-199856 A | 10/2014 |
| WO | 2015/045163 A1 | 4/2015 |

OTHER PUBLICATIONS

Japanese Office Action dated Jul. 3, 2018 for the Japanese Patent Application No. 2015-017930.

* cited by examiner

FIG. 9A

| NAME | PYRIDINE | AMINOPYRIDINE | PICOLINE | LUTIDINE | PIPERAZINE | PIPERIDINE |
|---|---|---|---|---|---|---|
| COMPOSITION FORMULA | $C_5H_5N$ | $C_5H_6N_2$ | $C_6H_7N$ | $C_7H_9N$ | $C_4H_{10}N_2$ | $C_5H_{11}N$ |
| STRUCTURAL FORMULA | | | | | | |
| ACID DISSOCIATION CONSTANT (pKa) | 5.67 | 6.89 | 6.07 | 6.96 | 9.80 | 11.12 |

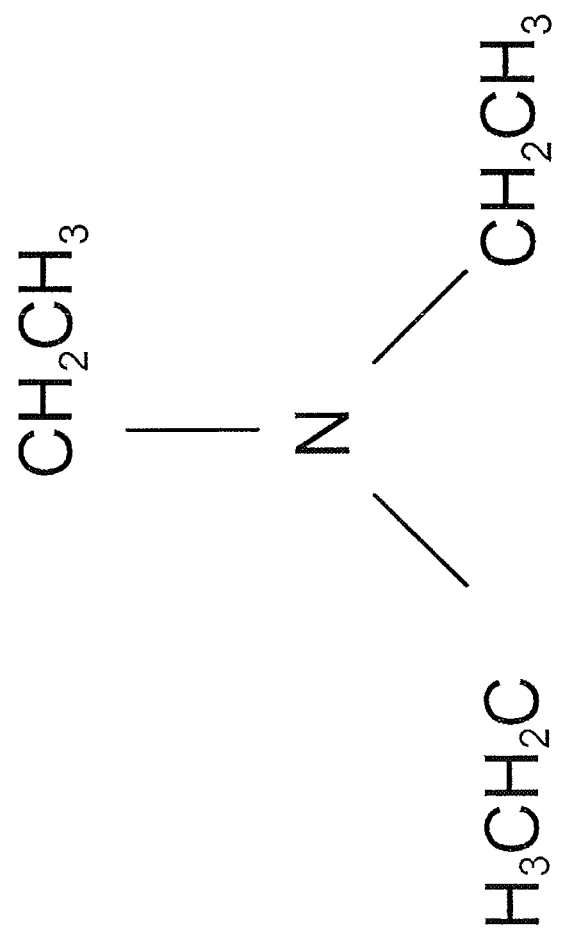

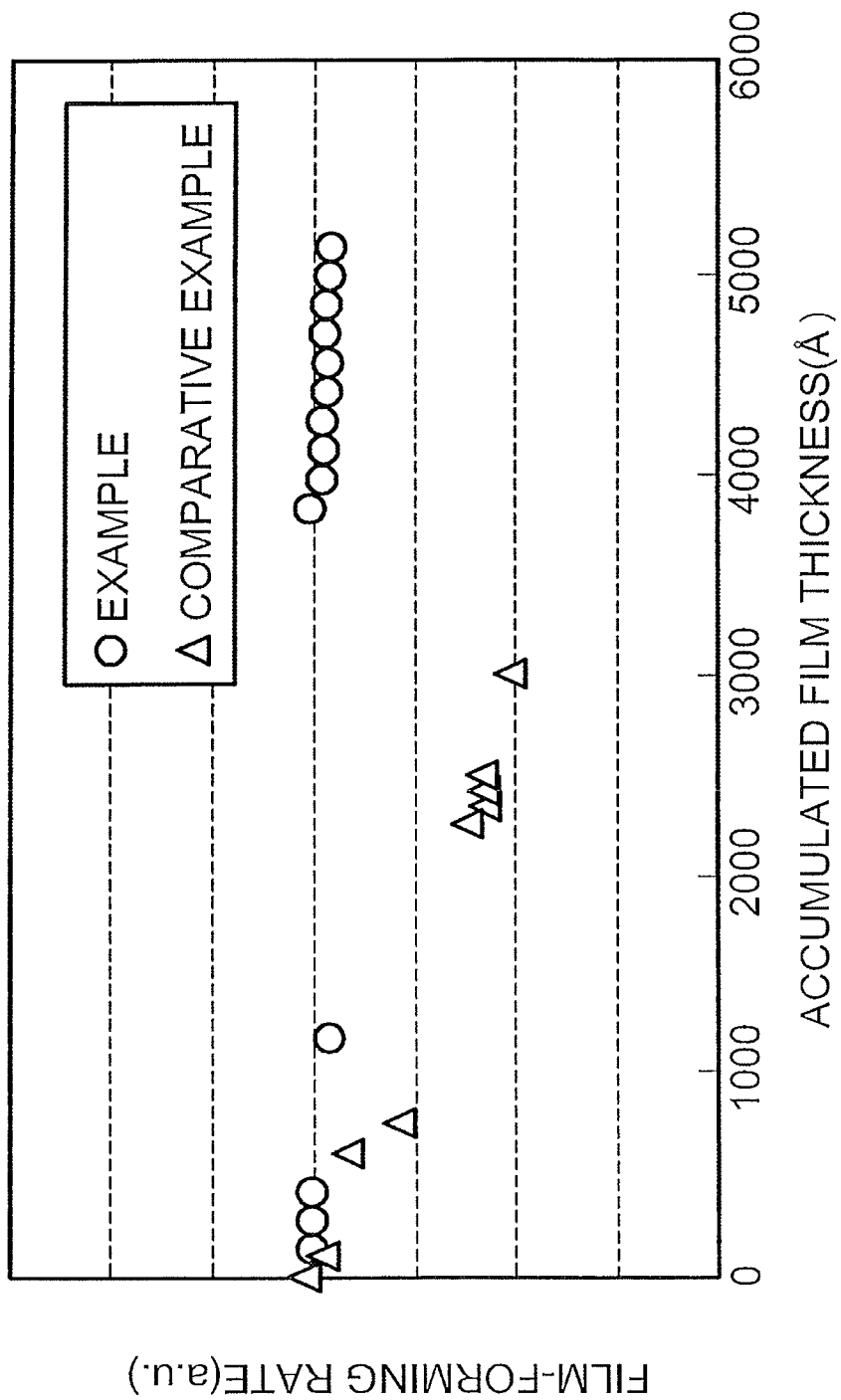

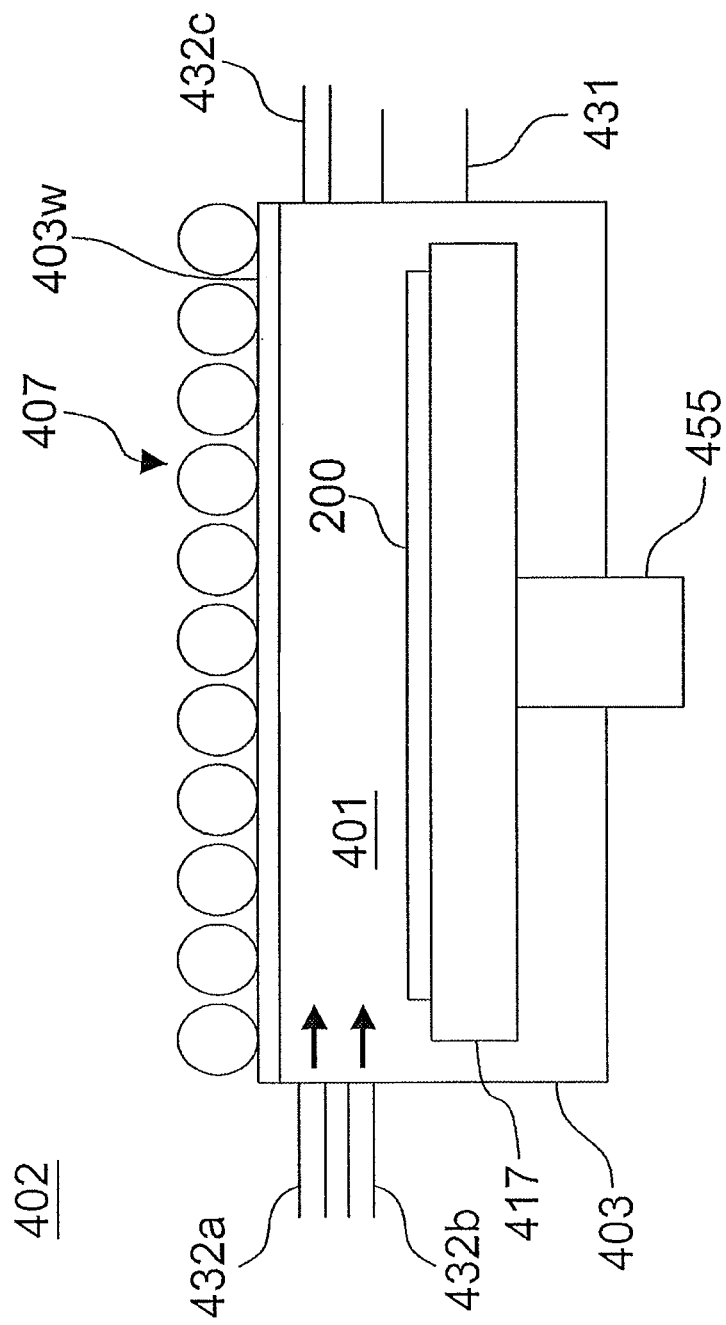

METHOD OF MANUFACTURING SEMICONDUCTOR DEVICE, SUBSTRATE PROCESSING APPARATUS AND RECORDING MEDIUM

CROSS-REFERENCE TO RELATED PATENT APPLICATION

This non-provisional U.S. patent application claims priority under 35 U.S.C. § 119 of Japanese Patent Application No. 2015-017930, filed on Jan. 30, 2015, the entire contents of which are hereby incorporated by reference.

BACKGROUND OF THE INVENTION

1. Field of the Invention

The present invention relates to a method of manufacturing a semiconductor device, a substrate processing apparatus and a recording medium.

2. Description of the Related Art

As a process of manufacturing a semiconductor device, a film-forming process in which at least a gas including a hydroxyl group is supplied to a substrate and a film is formed on the substrate, is performed in some cases.

SUMMARY OF THE INVENTION

The present invention provides technology capable of stabilizing a film-forming rate or film quality when a film is formed on a substrate.

According to an aspect of the present invention, there is provided technology including, a method of manufacturing a semiconductor device, including:

(a) forming a film on a substrate by supplying at least a gas including hydroxyl group to the substrate in a process chamber while maintaining a temperature of an inside of the process chamber at a first temperature;

(b) changing the temperature of the inside of the process chamber from the first temperature to a second temperature higher than the first temperature; and (c) maintaining the temperature of the inside of the process chamber at the second temperature at least in a state that the substrate is not in the process chamber.

BRIEF DESCRIPTION OF THE DRAWINGS

FIG. 9A is a diagram illustrating a chemical structural formula and the like of a cyclic amine, FIG. 9B is a diagram illustrating a chemical structural formula and the like of a chain amine, TEA.

FIG. 10A is a diagram illustrating an evaluation result of a film-forming rate.

FIG. 12 is a schematic configuration diagram of a processing furnace of a substrate processing apparatus preferably used in still another embodiment of the present invention and is a vertical cross-sectional view of the processing furnace portion.

DETAILED DESCRIPTION OF THE PREFERRED EMBODIMENTS

Embodiment of the Present Invention

An embodiment of the present invention will be described below with reference to FIGS. 1 through 3.

(1) Configuration of Substrate Processing Apparatus

Figure 1:
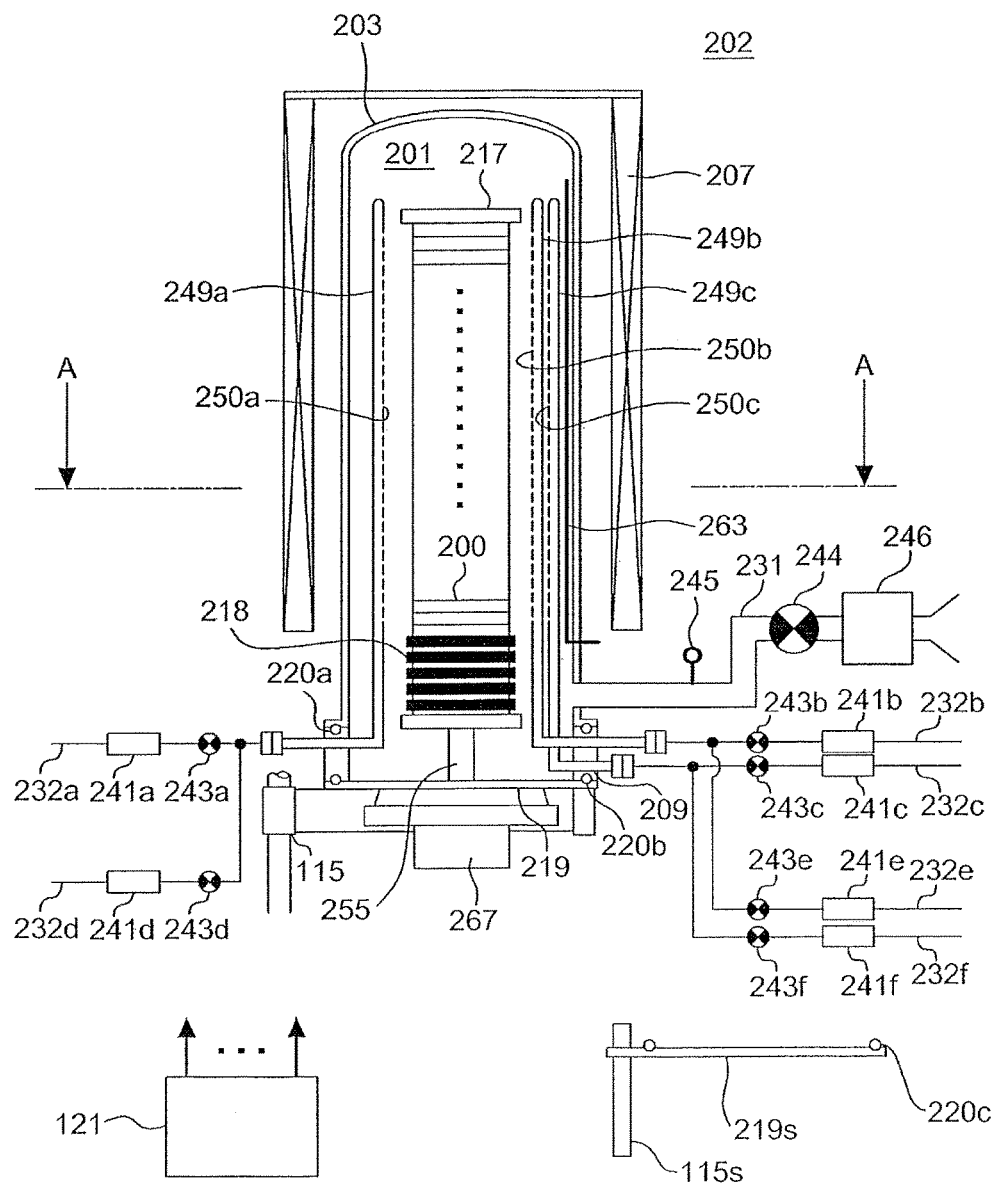
FIG. 1 is a schematic configuration diagram of a vertical processing furnace of a substrate processing apparatus preferably used in an embodiment of the present invention and is a vertical cross-sectional view of a processing furnace portion.
Figure 2:
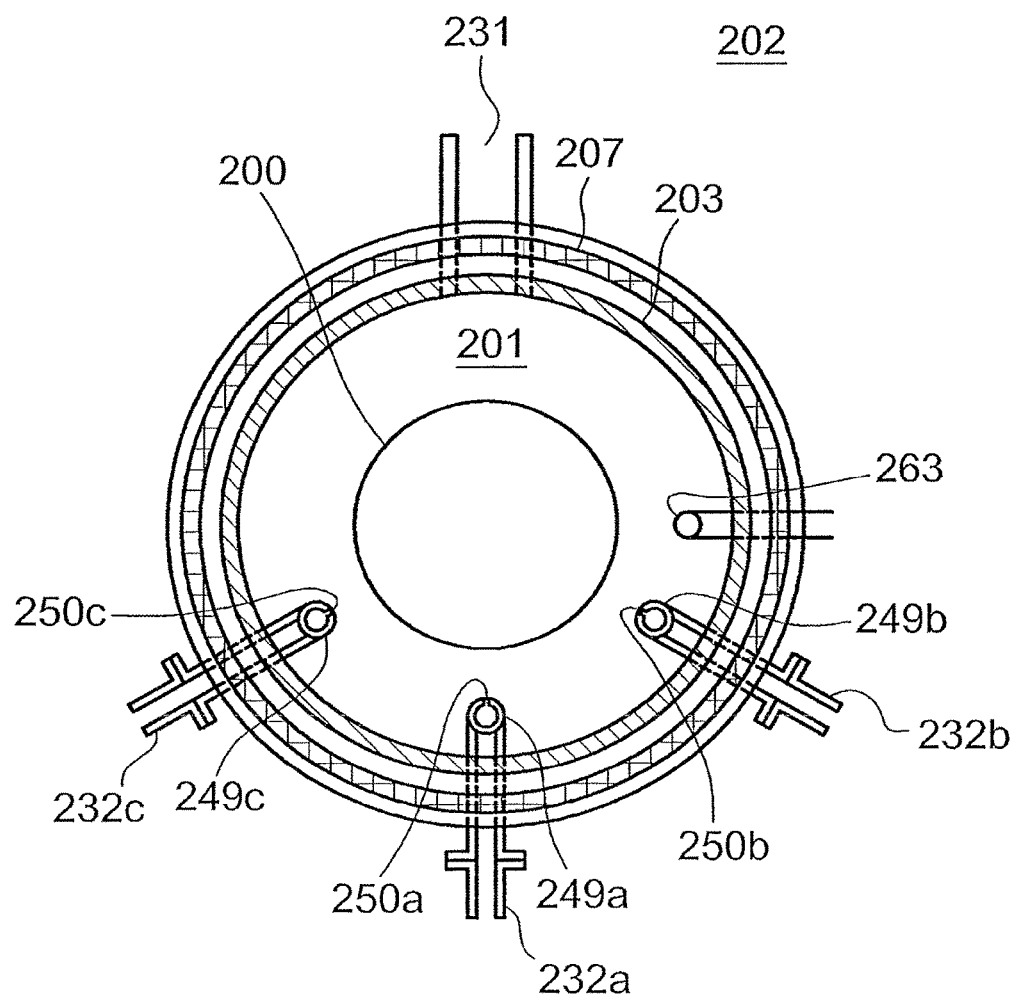
FIG. 2 is a schematic configuration diagram illustrating a part of a vertical processing furnace of a substrate processing apparatus preferably used in an embodiment of the present invention and is a cross-sectional view of a part of the processing furnace taken along line A-A of FIG. 1.

As illustrated in FIG. 1, a processing furnace 202 includes a heater 207 serving as a heating unit (heating mechanism). The heater 207 has a cylindrical shape and is vertically installed by being supported by a heater base (not illustrated) serving as a retaining plate. As will be described below, the heater 207 also functions as an activating mechanism for activating (exciting) a gas by heat.

In the heater 207, a reaction tube 203 is concentrically provided with respect to the heater 207. The reaction tube 203 is made of a heat-resistant material such as quartz ($SiO_2$) or silicon carbide (SiC) and is formed to have a cylindrical shape whose upper end is closed and whose lower end is open. Below the reaction tube 203, a manifold (inlet flange) 209 is concentrically provided with respect to the reaction tube 203. The manifold 209 is made of a metal such as stainless steel (SUS) and is formed to have a cylindrical shape whose upper end and lower end are open. An upper end of the manifold 209 is engaged with a lower end of the reaction tube 203 and is configured to support the reaction tube 203. An O-ring 220a serving as a seal member is installed between the manifold 209 and the reaction tube 203. When the manifold 209 is supported with the heater base, the reaction tube 203 is vertically installed. A process container (reaction container) mainly includes the reaction tube 203 and the manifold 209. A process chamber 201 is formed in a cylindrical hollow portion of the process container. The process chamber 201 is configured to accommodate wafers 200 serving as a plurality of substrates that are arranged in a horizontal orientation in multiple stages in a vertical direction by a boat 217 to be described below.

Nozzles 249a through 249c are installed in the process chamber 201 and penetrate the manifold 209. The nozzles 249a through 249c are made of a heat-resistant material such as quartz or SiC. Gas supply pipes 232a through 232c are connected to the nozzles 249a through 249c, respectively. In this manner, the three nozzles 249a through 249c and the three gas supply pipes 232a through 232c are installed in the reaction tube 203 and enable a plurality of types of gases to be supplied into the process chamber 201.

Mass flow controllers (MFCs) 241a through 241c serving as flow rate controllers (flow rate control units) and valves 243a through 243c serving as switching valves are installed in the gas supply pipes 232a through 232c in the order from the upstream end. Gas supply pipes 232d through 232f configured to supply an inert gas are connected at a downstream side of the valves 243a through 243c of the gas supply pipes 232a through 232c. MFCs 241d through 241f serving as flow rate controllers (flow rate control units) and valves 243d through 243f serving as switching valves are installed in the gas supply pipes 232d through 232f, in the order from the upstream end.

The nozzles 249a through 249c are connected to leading ends of the gas supply pipes 232a through 232c. As illustrated in FIG. 2, the nozzles 249a through 249c are installed in a cylindrical space between an inner wall of the reaction tube 203 and the wafer 200, from a lower inner wall to an upper inner wall of the reaction tube 203, to rise in a direction in which the wafers 200 are arranged. That is, the nozzles 249a through 249c are installed along a wafer arrangement region in which the wafers 200 are arranged, in a region that horizontally surrounds the wafer arrangement region at sides of the wafer arrangement region. That is, the nozzles 249a through 249c are vertically installed with respect to a surface (flat surface) of the wafer 200 at the sides of the ends (peripheral portions) of the wafers 200 loaded in the process chamber 201. The nozzles 249a through 249c is configured as an L-shaped long nozzle and includes a horizontal portion installed to penetrate a sidewall of the manifold 209 and a vertical portion installed to rise at least from one end of the wafer arrangement region to the other end of the wafer arrangement region. Gas supply holes 250a through 250c configured to supply a gas is installed at side surfaces of the nozzles 249a through 249c. The gas supply holes 250a through 250c may be opened to the center of the reaction tube 203 to supply a gas to the wafer 200. A plurality of gas supply holes 250a through 250c are installed from a lower part to an upper part of the reaction tube 203 and are installed to each have the same opening area at the same opening pitch.

In this manner, in the present embodiment, the gas is transferred through a longitudinally extending space having a cylindrical shape defined by an inner wall of the reaction tube 203 and ends of the plurality of arranged wafers 200, that is, through the nozzles 249a through 249c disposed in the cylindrical space. Also, through the gas supply holes 250a through 250c that are opened to the nozzles 249a through 249c, respectively, the gas is initially sprayed into the reaction tube 203 in the vicinity of the wafer 200. Also, a main flow of the gas in the reaction tube 203 is set in a direction parallel to a surface of the wafer 200, that is, a horizontal direction. In such a configuration, it is possible to uniformly supply the gas to each of the wafers 200, thereby increasing film thickness uniformity of a film to be formed on each of the wafers 200. The gas flowing along a surface of the wafer 200, that is, a residual gas after a reaction, flows toward an exhaust opening, that is, toward an exhaust pipe 231 to be described below. However, a flow direction of the residual gas is not limited to the vertical direction, but may be appropriately defined according to a location of the exhaust opening.

Through the gas supply pipe 232a, as a source gas containing a predetermined element, for example, a halosilane source gas containing silicon and a halogen element as the predetermined element, is supplied into the process chamber 201 through the MFC 241a, the valve 243a and the nozzle 249a.

The halosilane source gas refers to a halosilane source in a gaseous state, for example, a gas that is obtained by vaporizing a halosilane source that is in a liquid state at room temperature and normal pressure, a halosilane source that is in a gaseous state at room temperature and normal pressure or the like. The halosilane source is a silane source including a halogen group. The halogen group includes a chloro group, a fluoro group, a bromo group, an iodine group and the like. That is, the halogen group includes a halogen element such as chlorine (Cl), fluorine (F), bromine (Br), iodine (I) or the like. The halosilane source may be a type of halide. When the term "source" is used in this specification, it may refer to either or both of "a liquid source in a liquid state" or "a source gas in a gaseous state."

Figure 6A:
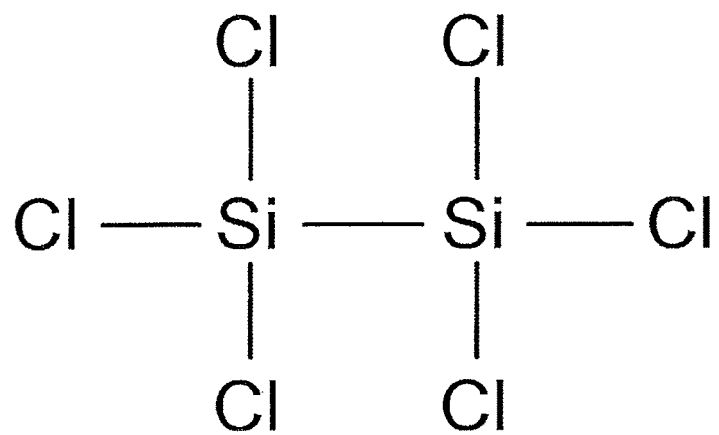
FIG. 6A is a diagram illustrating a chemical structural formula of HCDS.
Figure 6B:
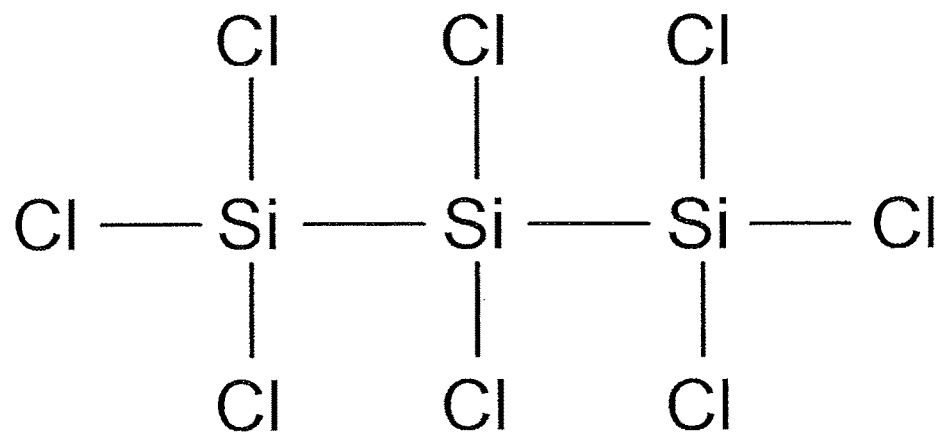
FIG. 6B is a diagram illustrating a chemical structural formula of OCTS.

As the halosilane source gas, for example, a carbon-free source gas containing silicon and chlorine, that is, an inorganic chlorosilane source gas, may be used. As the inorganic chlorosilane source gas, for example, hexachlorodisilane ($Si_2Cl_6$, abbreviated as HCDS) gas or octachlorotrisilane ($Si_3Cl_8$, abbreviated as OCTS) gas may be used. FIG. 6A shows a chemical structural formula of HCDS and FIG. 6B shows a chemical structural formula of OCTS. These gases may be source gases that contain at least two silicon atoms in a molecule, includes chlorine and has a Si—Si bond. These gases serve as a silicon source in a film-forming process to be described below.

Figure 7A:
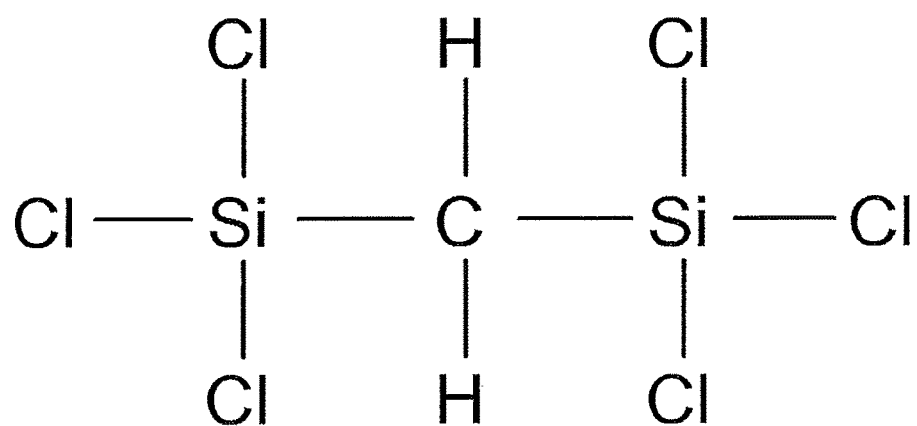
FIG. 7A is a diagram illustrating a chemical structural formula of BTCSM.
Figure 7B:
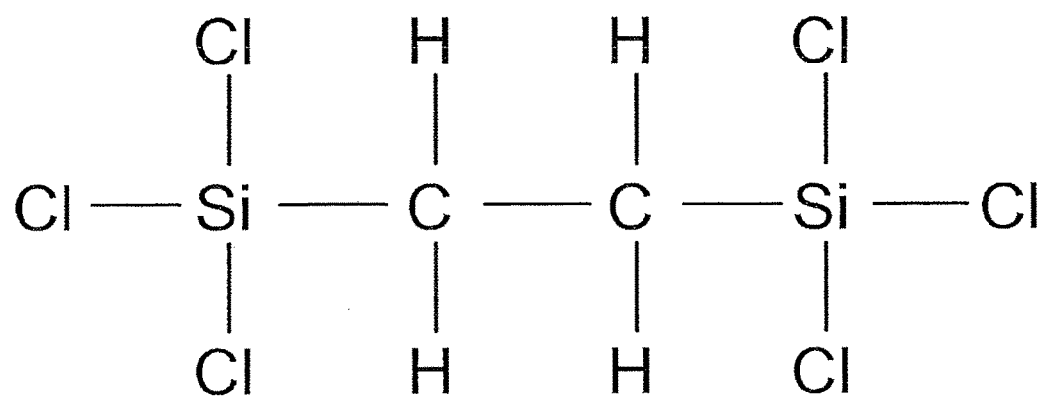
FIG. 7B is a diagram illustrating a chemical structural formula of BTCSE.

Also, as the halosilane source gas, for example, a source gas that contains silicon, chlorine and an alkylene group and has a Si—C bond, that is, an alkylene chlorosilane source gas, which is an organic chlorosilane source gas, may be used. The alkylene group includes a methylene group, an ethylene group, a propylene group, a butylene group and the like. The alkylene chlorosilane source gas may also be called an alkylene halosilane source gas. As the alkylene chlorosilane source gas, for example, bis(trichlorosilyl)methane [$(SiCl_3)_2CH_2$, abbreviated as BTCSM] gas, ethylenebis(trichlorosilane) gas, that is, 1,2-bis(trichlorosilyl)ethane [$(SiCl_3)_2C_2H_4$, abbreviated as BTCSE] gas or the like may be used. FIG. 7A illustrates a chemical structural formula of BTCSM. FIG. 7B illustrates a chemical structural formula of BTCSE. These gases may be source gases that contain at least two silicon atoms in a molecule, includes carbon and chlorine and has a Si—C bond. These gases serve as a silicon source and a carbon source in the film-forming process to be described below.

Figure 8A:
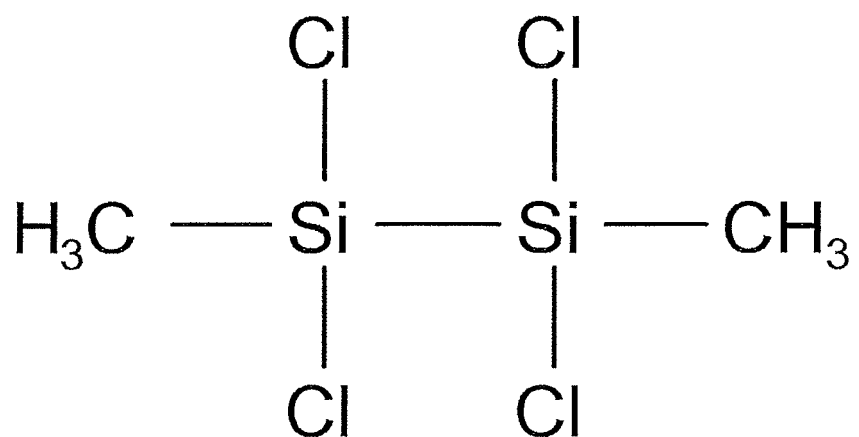
FIG. 8A is a diagram illustrating a chemical structural formula of TCDMDS.
Figure 8B:
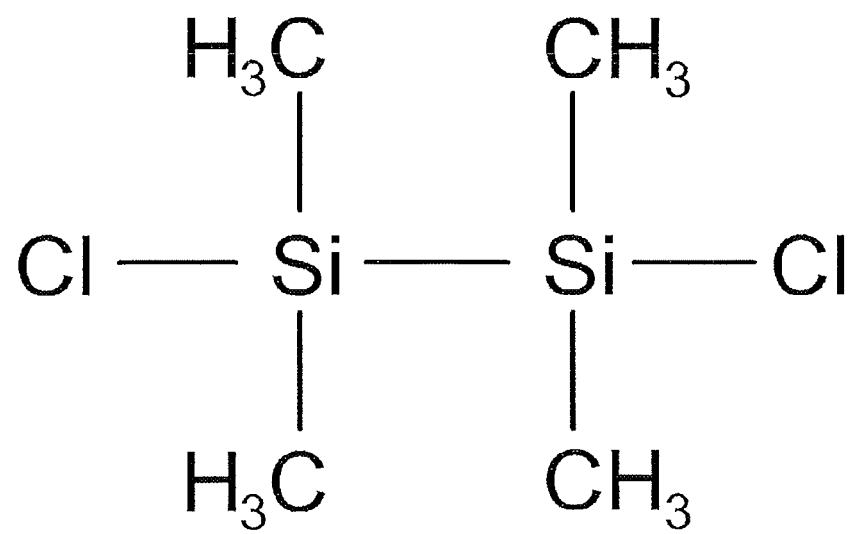
FIG. 8B is a diagram illustrating a chemical structural formula of DCTMDS.
Figure 8C:
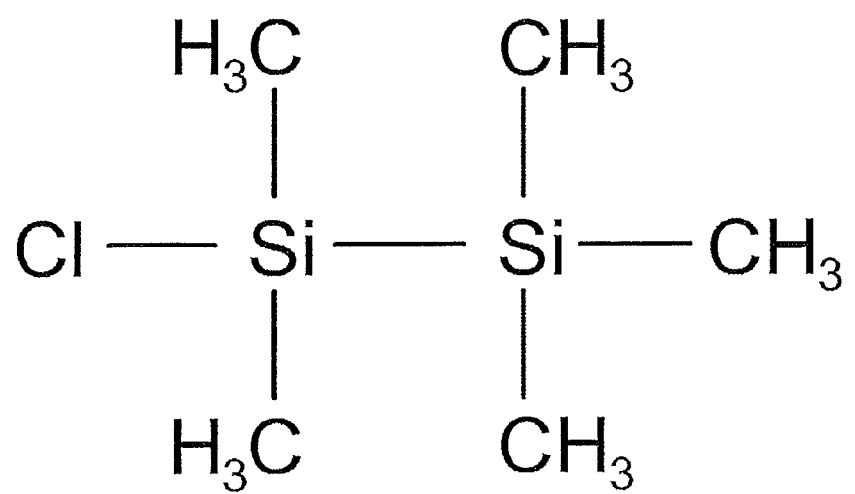
FIG. 8C is a diagram illustrating a chemical structural formula of MCP-MDS.
Figure 9C:
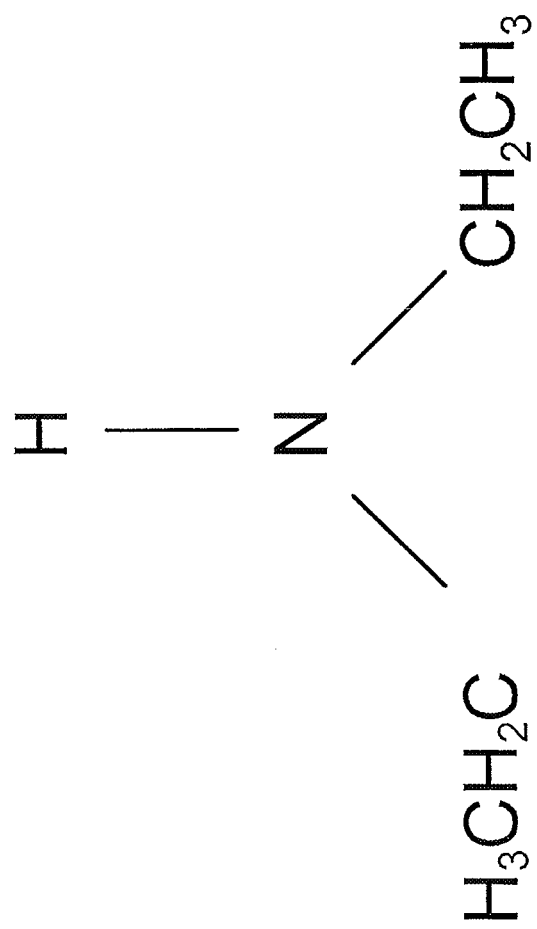
FIG. 9C is a diagram illustrating a chemical structural formula and the like of a chain amine, DEA.
Figure 9D:
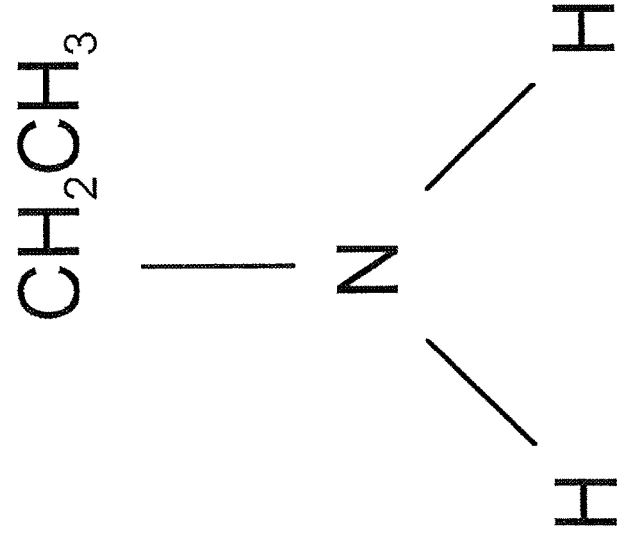
FIG. 9D is a diagram illustrating a chemical structural formula and the like of a chain amine, MEA.
Figure 9E:
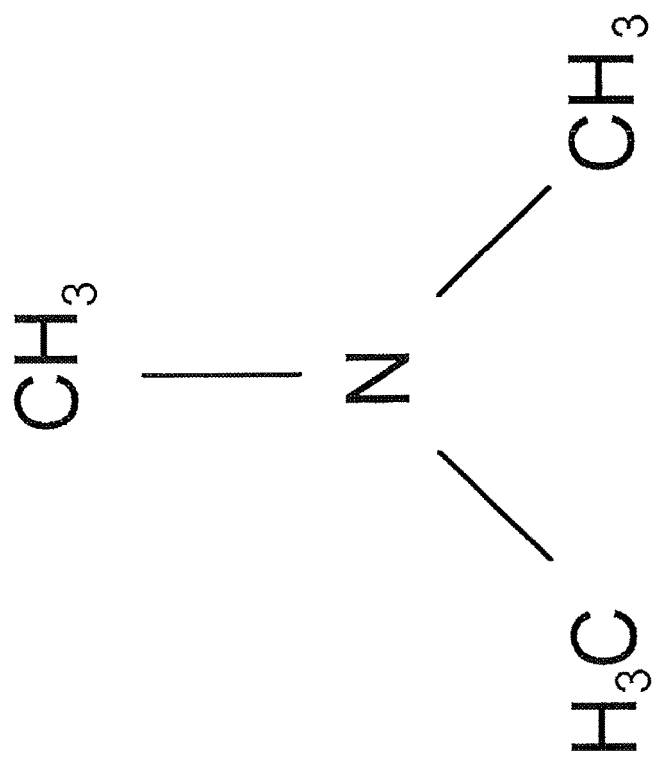
FIG. 9E is a diagram illustrating a chemical structural formula and the like of a chain amine, TMA.
Figure 9F:
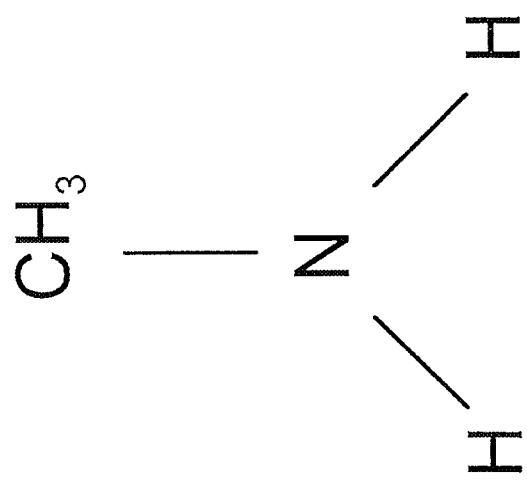
FIG. 9F is a diagram illustrating a chemical structural formula and the like of a chain amine, MMA.

Also, as the halosilane source gas, for example, a source gas that includes silicon, chlorine and an alkyl group and has a Si—C bond, that is, an alkyl chlorosilane source gas, which is an organic chlorosilane source gas, may be used. The alkyl group includes a methyl group, an ethyl group, a propyl group, a butyl group and the like. The alkyl chlorosilane source gas may also be called an alkyl halosilane source gas. As the alkyl chlorosilane source gas, for example, 1,1,2,2-tetrachloro-1,2-dimethylsilane [$(CH_3)_2Si_2Cl_4$, abbreviated as TCDMDS] gas, 1,2-dichloro-1,1,2,2-tetramethyldisilane [$(CH_3)_4Si_2Cl_2$, abbreviated as DCTMDS] gas or 1-monochloro-1,1,2,2,2-pentamethyldisilane [$(CH_3)_5Si_2Cl$, abbreviated as MCPMDS] gas may be used. FIG. 8A illustrates a chemical structural formula of TCDMDS. FIG. 8B illustrates a chemical structural formula of DCTMDS. FIG. 8C illustrates a chemical structural formula of MCPMDS. These gases may be source gases that contain at least two silicon atoms in a molecule, includes carbon and chlorine and has a Si—C bond. These gases also have Si—Si bonds. These gases serve as a silicon source and a carbon source in the film-forming process to be described below.

When a liquid source that is in a liquid state at room temperature and normal pressure such as HCDS, BTCSM or TCDMDS is used, the source in a liquid state is vaporized by a vaporization system such as a vaporizer or a bubbler and then is supplied as a source gas (such as HCDS gas, BTCSM gas and TCDMDS gas).

Through the gas supply pipe 232b, as a reactive gas having a different chemical structure from the source gas, a gas including a hydroxyl group is supplied into the process chamber 201 through the MFC 241b, the valve 243b and the nozzle 249b. The gas including a hydroxyl group serves as an oxidant (oxidizing gas), that is, an oxygen source in the film-forming process to be described below. As the gas including a hydroxyl group, for example, water vapor ($H_2O$ gas) may be used. Pure water [or ultrapure water], for example, reverse osmosis (RO) water whose impurities are removed using a reverse osmosis membrane, deionized water whose impurities are removed by performing a deionization process, or distilled water whose impurities are removed by performing distillation using a distiller is vaporized by a vaporization system such as a vaporizer, a bubbler or a boiler and supplied as a gas including a hydroxyl group ($H_2O$ gas).

Through the gas supply pipe 232c, the above-described source gas or a catalytic gas that promotes a film-forming reaction by the reactive gas is supplied into the process chamber 201 through the MFC 241c, the valve 243c and the nozzle 249c. As the catalytic gas, for example, an amine-based gas containing C, N and H may be used.

The amine-based gas refers to a gas containing an amine in which at least one of H atoms of ammonia ($NH_3$) is replaced with a hydrocarbon group such as an alkyl group. As illustrated in FIGS. 9A to 9F, an amine including N having a lone pair of electrons and whose acid dissociation constant (hereinafter referred to as "pKa") is, for example, about 5 to 11, may be preferably used as a catalyst. The acid dissociation constant (pKa) is one of the indices that quantitatively represent a degree of strength of the acid and is obtained when an equilibrium constant Ka in a dissociation reaction in which hydrogen ions are discharged from the acid is represented as a negative common logarithm. As the amine-based gas, a cyclic amine-based gas having a cyclic hydrocarbon group or a chain amine-based gas having a chain hydrocarbon group may be used.

As the cyclic amine-based gas, as illustrated in FIG. 9A, for example, pyridine ($C_5H_5N$, pKa=5.67) gas, aminopyridine ($C_5H_6N_2$, pKa=6.89) gas, picoline ($C_6H_7N$, pKa=6.07) gas, lutidine ($C_7H_9N$, pKa=6.96) gas, piperazine ($C_4H_{10}N_2$, pKa=9.80) gas, or piperidine ($C_5H_{11}N$, pKa=11.12) gas may be used. The cyclic amine-based gas may be a heterocyclic compound whose cyclic structure is configured as a plurality of types of elements of carbon and nitrogen, that is, a nitrogen-containing heterocyclic compound.

As the chain amine-based gas, as illustrated in FIGS. 9B to 9F, for example, triethylamine [$(C_2H_5)_3N$, abbreviated as TEA, pKa=10.7] gas, diethylamine [$(C_2H_5)_2NH$, abbreviated as DEA, pKa=10.9] gas, monoethylamine [$(C_2H_5)NH_2$, abbreviated as MEA, pKa=10.6] gas, trimethylamine [$(CH_3)_3N$, abbreviated as TMA, pKa=9.8] gas, or monomethylamine [$(CH_3)NH_2$, abbreviated as MMA, pKa=10.6] gas may be used.

The amine-based gas serving as a catalyst may also be called an amine-based catalyst or an amine-based catalytic gas. As the catalytic gas, in addition to the above-described amine-based gas, a non-amine-based gas, for example, ammonia ($NH_3$, pKa=9.2) gas may be used.

Also, the catalyst exemplified herein may have a partially decomposed molecular structure in the film-forming process to be described below. A material that is partially changed before and after such a chemical reaction is not a "catalyst" strictly speaking. However, in this specification, a material that is partially decomposed during a chemical reaction process but remains mostly undecomposed and that substantially serves as a catalyst by changing a reaction rate is called a "catalyst."

Through the gas supply pipes 232d through 232f, as the inert gas, for example, nitrogen ($N_2$) gas, is supplied into the process chamber 201 through the MFCs 241d through 241f, the valves 243d through 243f, the gas supply pipes 232a through 232c and the nozzles 249a through 249c.

When the above-described source gas is supplied through the gas supply pipe 232a, a source gas supply system mainly includes the gas supply pipe 232a, the MFC 241a and the valve 243a. The nozzle 249a may be included in the source gas supply system. The source gas supply system may also be called a source supply system. When a halosilane source gas is supplied through the gas supply pipe 232a, the source gas supply system may also be called a halosilane source gas supply system or a halosilane source supply system.

When the above-described reactive gas is supplied through the gas supply pipe 232b, a reactive gas supply system mainly includes the gas supply pipe 232b, the MFC 241b and the valve 243b. The nozzle 249b may be included in the reactive gas supply system. When a gas including a hydroxyl group is supplied through the gas supply pipe 232b, the reactive gas supply system may also be called a hydroxyl group-including gas supply system, an oxygen-containing gas supply system, an oxidant supply system, or an oxidizing gas supply system.

When the above-described catalytic gas is supplied through the gas supply pipe 232c, a catalytic gas supply system mainly includes the gas supply pipe 232c, the MFC 241c and the valve 243c. The nozzle 249c may be included in the catalytic gas supply system. The catalytic gas supply system may also be called a catalyst supply system. When the amine-based gas is supplied through the gas supply pipe 232c, the catalytic gas supply system may also be called an amine-based catalytic gas supply system, an amine-based gas supply system, or an amine supply system.

Also, an inert gas supply system mainly includes the gas supply pipes 232d through 232f, the MFCs 241d through 241f and the valves 243d through 243f. The inert gas supply system may also be called a purge gas supply system, a dilution gas supply system, or a carrier gas supply system.

In the reaction tube 203, the exhaust pipe 231 configured to exhaust an atmosphere in the process chamber 201 is installed. In the exhaust pipe 231, a pressure sensor 245 serving as a pressure detector (a pressure detecting unit) configured to detect a pressure in the process chamber 201 and a vacuum pump 246 serving as a vacuum exhaust device through an auto pressure controller (APC) valve 244 serving as a pressure regulator (a pressure regulating unit) are connected. The APC valve 244 is a valve that may perform vacuum-exhaust and vacuum-exhaust stop in the process chamber 201 by switching the valve while the vacuum pump 246 is operated and regulate a pressure in the process chamber 201 by regulating the degree of valve opening based on information on pressure detected by the pressure sensor 245 while the vacuum pump 246 is operated. An exhaust system mainly includes the exhaust pipe 231, the APC valve 244 and the pressure sensor 245. The vacuum pump 246 may be included in the exhaust system. The exhaust pipe 231 is not limited to be being installed in the reaction tube 203 but may be installed in the manifold 209 similarly to the nozzles 249a through 249c.

Below the manifold 209, a seal cap 219 capable of hermetically sealing a lower opening of the manifold 209 is installed as a furnace port cover. The seal cap 219 is configured to abut a lower end of the manifold 209 in a vertical direction from below. The seal cap 219 is made of a metal such as SUS and has a disk shape. An O-ring 220b is installed as a seal member on an upper surface of the seal cap 219 that abuts the lower end of the manifold 209. A rotating mechanism 267 configured to rotate the boat 217 to be described below is installed opposite to the process chamber 201 side of the seal cap 219. A rotating shaft 255 of the rotating mechanism 267 penetrates the seal cap 219 and is connected to the boat 217. The rotating mechanism 267 is configured to rotate the wafer 200 by rotating the boat 217. The seal cap 219 is configured to be vertically lifted by a boat elevator 115 serving as a lifting mechanism that is vertically installed at the outside of the reaction tube 203. The boat elevator 115 is configured to load or unload the boat 217 into or from the process chamber 201 by lifting the seal cap 219. That is, the boat elevator 115 is configured as a transfer device (a transfer mechanism) that transfers the boat 217, that is, the wafer 200, into or out of the process chamber 201. Also, below the manifold 209, a shutter 219s capable of hermetically sealing the lower opening of the manifold 209 while the seal cap 219 is lowered by the boat elevator 115 is installed as a furnace port cover. The shutter 219s is made of a metal such as stainless steel and has a disk shape. An O-ring 220c is installed as a seal member on an upper surface of the shutter 219s that abuts the lower end of the manifold 209. A switch operation (such as a lifting operation or a rotating operation) of the shutter 219s is controlled by a shutter switching mechanism 115s.

The boat 217 serving as a substrate support is configured to support the plurality of wafers 200 on multiple stages, for example, 25 to 200 wafers 200, that are vertically arranged in a horizontal orientation while centers thereof are aligned, that is, to support the wafers arranged at intervals. The boat 217 is made of a heat-resistant material such as quartz or SiC. Below the boat 217, an insulation plate 218 made of a heat-resistant material such as quartz or SiC is supported in a horizontal orientation on multiple stages. According to such a configuration, heat from the heater 207 is not easily transferred to the seal cap 219 side. However, the present embodiment is not limited to the above-described form. For example, no insulation plate 218 is installed below the boat 217 and an insulation tube configured as a tubular member made of a heat-resistant material such as quartz or SiC may be installed.

A temperature sensor 263 serving as a temperature detector is installed in the reaction tube 203. By regulating power supply to the heater 207 based on information on the temperature detected by the temperature sensor 263, the temperature in the process chamber 201 is set to have a desired temperature distribution. Similarly to the nozzles 249a through 249c, the temperature sensor 263 is configured as an L shape and is installed along the inner wall of the reaction tube 203.

Figure 3:
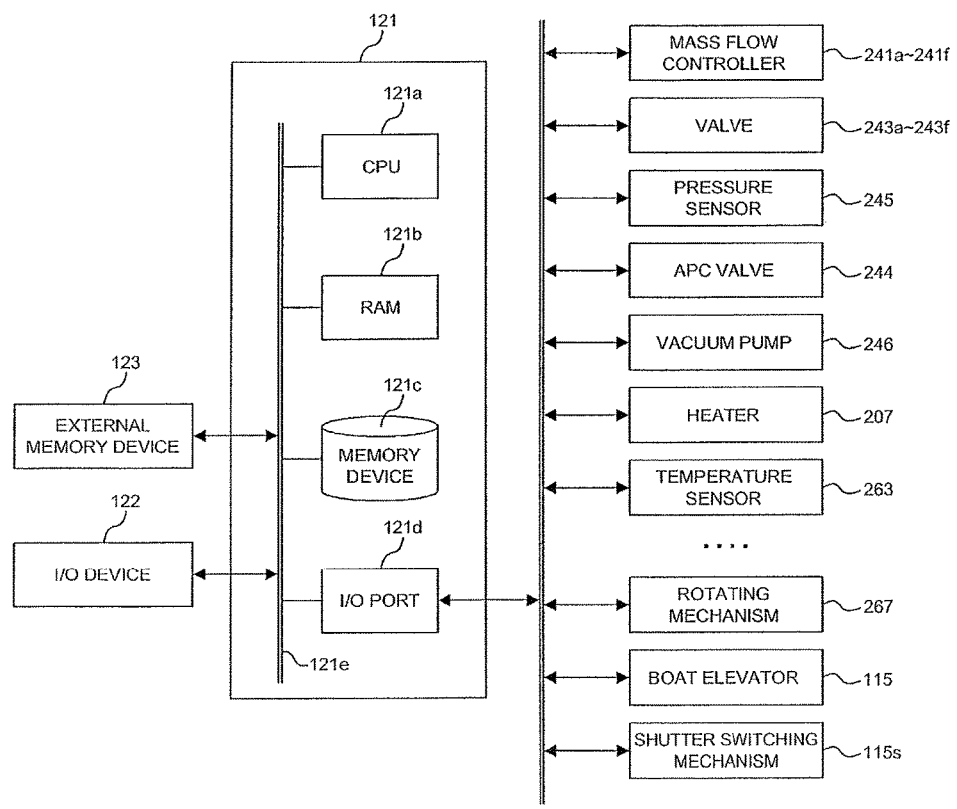
FIG. 3 is a schematic configuration diagram of a controller of a substrate processing apparatus preferably used in an embodiment of the present invention and is a block diagram of a control system of the controller.

As illustrated in FIG. 3, a controller 121 serving as a control unit (a control device) is configured as a computer that includes a central processing unit (CPU) 121a, a random access memory (RAM) 121b, a memory device 121c and an I/O port 121d. The RAM 121b, the memory device 121c and the I/O port 121d are configured to exchange data with the CPU 121a through an internal bus 121e. An I/O device 122 configured as, for example, a touch panel, is connected to the controller 121.

The memory device 121c is configured as, for example, a flash memory and a hard disk drive (HDD). A control program controlling operations of the substrate processing apparatus, a process recipe describing sequences or conditions of substrate processing (to be described below) and the like are readably stored in the memory device 121c. The process recipe, which is a combination of sequences, causes the controller 121 to execute each sequence in the substrate processing process to be described below in order to obtain a predetermined result and functions as a program. Hereinafter, such a process recipe, a control program and the like are collectively simply called a "program." When the term "program" is used in this specification, it may refer to either or both of the process recipe and the control program. The RAM 121b is configured as a memory area (work area) in which a program, data and the like read by the CPU 121a are temporarily stored.

The I/O port 121d is connected to the MFCs 241a through 241f, the valves 243a through 243f, the pressure sensor 245, the APC valve 244, the vacuum pump 246, the heater 207, the temperature sensor 263, the rotating mechanism 267, the boat elevator 115, the shutter switching mechanism 115s and the like.

The CPU 121a reads and executes the control program from the memory device 121c and reads the process recipe from the memory device 121c according to an input of a manipulating command from the I/O device 122. To execute the content of the read process recipe, the CPU 121a is configured to control a flow rate regulating operation of various types of gases by the MFCs 241a through 241f, an opening and closing operation of the valves 243a through 243f, an opening and closing operation of the APC valve 244, a pressure regulating operation by the APC valve 244 based on the pressure sensor 245, starting and stopping of the vacuum pump 246, a temperature regulating operation of the heater 207 based on the temperature sensor 263, a rotation and rotational speed regulating operation of the boat 217 by the rotating mechanism 267, a lifting operation of the boat 217 by the boat elevator 115, an opening and closing operation of the shutter 219s by the shutter switching mechanism 115s and the like.

The controller 121 may be configured by installing the above-described program stored in an external memory device 123 [for example, a magnetic tape, a magnetic disk such as a flexible disk and a hard disk, an optical disc such as a compact disc (CD) and a digital video disc (DVD), a magneto-optical disc such as an MO, a semiconductor memory such as a Universal Serial Bus (USB) memory and a memory card] in a computer. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123. Also, a communication line such as the Internet or an exclusive line may be used to supply the program to the computer without using the external memory device 123.

(2) Substrate Processing Process

An exemplary substrate process that is performed as a process among manufacturing processes of a semiconductor apparatus (semiconductor device) using the above-described substrate processing apparatus will be described with reference to FIGS. 5A and 4. In the following description, operations of units of the substrate processing apparatus are controlled by the controller 121.

Figure 5A:
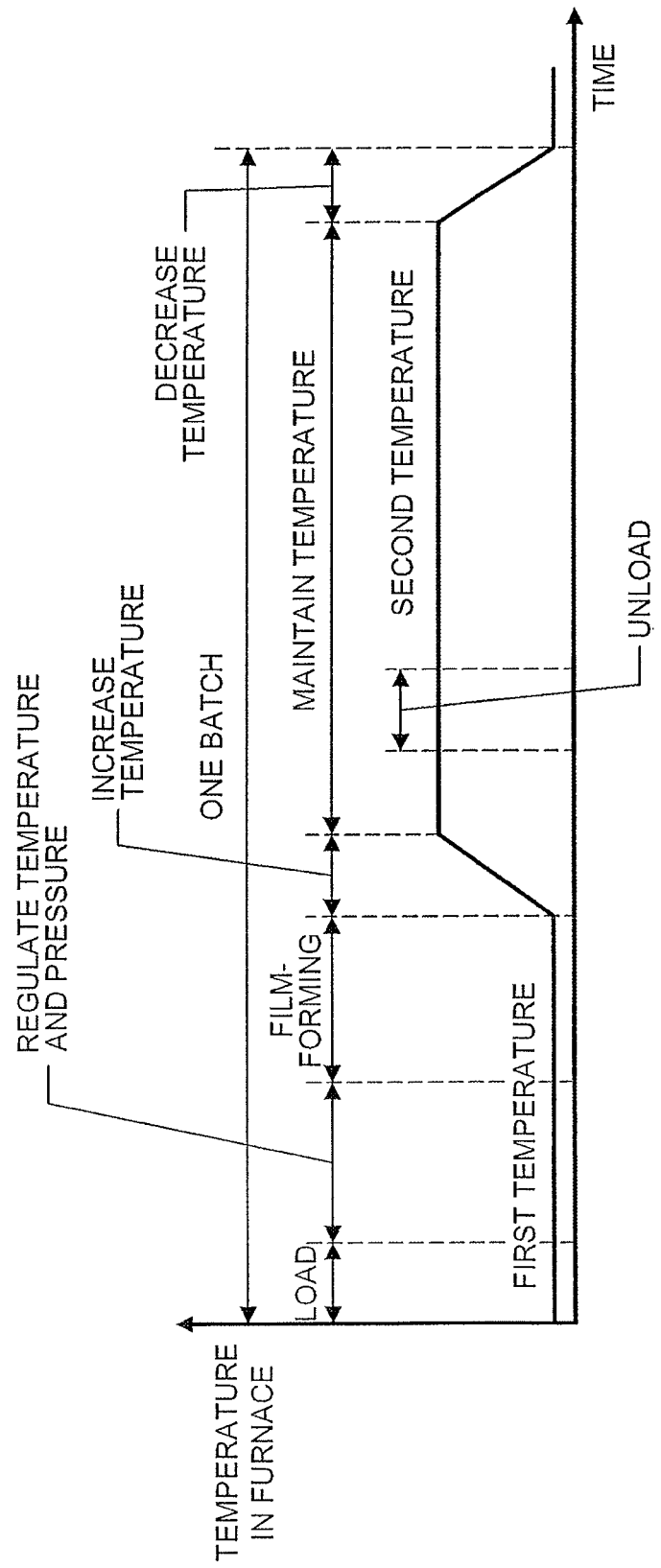
FIG. 5A is a diagram illustrating a substrate processing sequence of an embodiment of the present invention.

In a substrate process exemplified in FIG. 5A, a batch process is performed a plurality of times. The batch process includes a film-forming step in which a gas including at least a hydroxyl group is supplied to the wafer 200 serving as a substrate in the process chamber 201 that is set to a first temperature and a film is formed on the wafer 200; a temperature increasing step in which the temperature in the process chamber 201 is changed from the first temperature to a second temperature that is higher than the first temperature; and a temperature maintaining step in which an inside of the process chamber 201 is maintained at the second temperature at least with no wafer 200 in the process chamber 201.

FIG. 5A illustrates one batch process that is extracted from the (batch) processes performed a plurality of times for convenience of description. Also, in FIG. 5A, the film-forming step, the temperature increasing step and the temperature maintaining step performed in the batch process are represented as "film-forming," "increase temperature," and "maintain temperature," respectively. Also, a loading step, a temperature and pressure regulating step, an unloading step and a temperature decreasing step (to be described below) performed in the batch process are represented as "load," "regulate temperature and pressure," "unload," and "decrease temperature."

Figure 4:
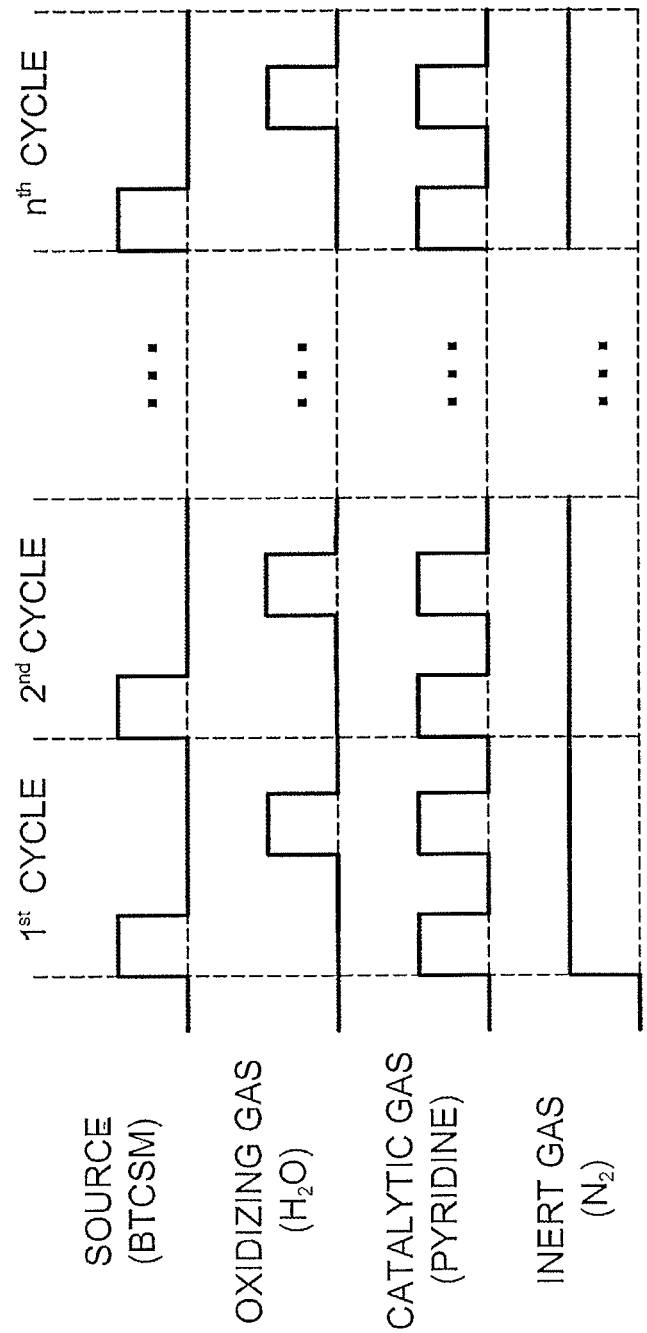
FIG. 4 is a diagram illustrating a film-forming sequence of an embodiment of the present invention.

Also, in a film-forming step exemplified in FIG. 4, a cycle is performed a predetermined number of times (once or more) and thus a silicon oxycarbide film (SiOC film) is formed as a film containing Si, O and C on the wafer 200. The cycle includes Step 1 in which BTCSM gas serving as a source gas and pyridine gas serving as a catalytic gas are supplied to the wafer 200; and Step 2 in which $H_2O$ gas serving as a gas including a hydroxyl group and pyridine gas serving as a catalytic gas are supplied to the wafer 200. These steps are performed non-simultaneously, that is, asynchronously and alternately. Also, in the present embodiment, an example in which the catalytic gas used in Step 1 has the same molecular structure as the catalytic gas used in Step 2 is proposed.

In this specification, a film-forming sequence illustrated in FIG. 4 may be described as follows for convenience of description. Also, the same notation will be used when the following modification or other embodiments are described.

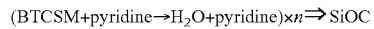
$(BTCSM+pyridine \rightarrow H_2O+pyridine) \times n \Rightarrow SiOC$ When the term "wafer" is used in this specification, it refers to "the wafer itself," or a "laminate (aggregate) of a wafer, a predetermined layer, film and the like formed on a surface thereof," that is, the wafer refers to a wafer including a predetermined layer, film and the like formed on a surface thereof. In addition, when the term "surface of the wafer" is used in this specification, it refers to "a surface (exposed surface) of the wafer itself" or "a surface of a predetermined layer, film and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

(Loading Step)

When the plurality of wafers 200 are loaded (wafer charging) on the boat 217, the shutter 219s is moved by the shutter switching mechanism 115s and the lower opening of the manifold 209 is opened (shutter open). Then, as illustrated in FIG. 1, the boat 217 supporting the plurality of wafers 200 is lifted by the boat elevator 115 and is loaded (boat loading) into the process chamber 201. In this state, the lower end of the manifold 209 is sealed by the seal cap 219 with the O-ring 220b in between.

(Temperature and Pressure Regulating Step)

Vacuum exhaust (evacuation) is performed by the vacuum pump 246 such that an inside of the process chamber 201, that is, a space in which the wafer 200 is present, has a desired pressure (degree of vacuum). In this case, a pressure in the process chamber 201 is measured by the pressure sensor 245 and the APC valve 244 is feedback-controlled based on information on the measured pressure. The vacuum pump 246 is continuously operated at least until processing on the wafer 200 is completed. Also, the wafer 200 in the process chamber 201 is heated to a desired temperature (a first temperature to be described below) by the heater 207. In this case, based on information on the temperature detected by the temperature sensor 263, power supply to the heater 207 is feedback-controlled such that an inside of the process chamber 201 has a desired temperature distribution. The heating of the inside of the process chamber 201 by the heater 207 is continuously performed at least until processing on the wafer 200 is completed. Also, the rotating mechanism 267 begins to rotate the boat 217 and the wafer 200. The rotation of the boat 217 and the wafer 200 by the rotating mechanism 267 is continuously performed at least until processing on the wafer 200 is completed.

(Film-Forming Step)

Then, the following two steps, Step 1 and Step 2, are sequentially performed.

[Step 1]

In this step, BTCSM gas and pyridine gas are supplied to the wafer 200 in the process chamber 201.

The valves 243a and 243c are opened to flow BTCSM gas into the gas supply pipe 232a and pyridine gas into the gas supply pipe 232c. BTCSM gas and pyridine gas whose flow rates are regulated by the MFCs 241a and 241c are supplied into the process chamber 201 through the nozzles 249a and 249c, mixed (post-mix) after being supplied into the process chamber 201 and exhausted through the exhaust pipe 231. At the same time, the valves 243d and 243f are opened to flow $N_2$ gas into the gas supply pipes 232d and 232f. $N_2$ gas flowing into the gas supply pipes 232d and 232f whose flow rates are regulated by the MFCs 241d and 241f, respectively, is supplied into the process chamber 201 along with BTCSM gas and pyridine gas and exhausted through the exhaust pipe 231. Also, in order to prevent BTCSM gas and pyridine gas from entering the nozzle 249b, the valve 243e is opened to flow $N_2$ gas into the gas supply pipe 232e. $N_2$ gas is supplied into the process chamber 201 through the gas supply pipe 232b and the nozzle 249b and exhausted through the exhaust pipe 231.

In this case, the APC valve 244 is appropriately regulated to set a pressure in the process chamber 201 to a pressure in a range of, for example, 1 Pa to 3,000 Pa and preferably 133 Pa to 2,666 Pa. A supply flow rate of BTCSM gas controlled by the MFC 241a is set to, for example, a flow rate in a range of 1 sccm to 2,000 sccm and preferably 10 sccm to 1,000 sccm. A supply flow rate of pyridine gas controlled by the MFC 241c is set to, for example, a flow rate in a range of 1 sccm to 2,000 sccm and preferably 10 sccm to 1,000 sccm. A supply flow rate of $N_2$ gas controlled by the MFCs 241d through 241f is each set to, for example, a flow rate in a range of 100 sccm to 10,000 sccm. A time for which BTCSM gas and pyridine gas are supplied to the wafer 200, that is, a gas supply time [radiation time] is set to, for example, a time in a range of 1 to 100 seconds and preferably 5 to 60 seconds.

In this case, a temperature of the heater 207 is set such that the temperature in the process chamber 201 is set to, for example, a temperature (first temperature) in a range of 10° C. or more and 90° C. or less, preferably room temperature (25° C.) or more and 70° C. or less and more preferably 50° C. or more and 70° C. or less.

When the pressure in the process chamber 201 is set to a predetermined pressure (for example, 1,333 Pa or less) within the above range, if the temperature in the process chamber 201 in the film-forming step is less than 10° C., gases (at least one of BTCSM gas, $H_2O$ gas and pyridine gas supplied in Step 1 and Step 2) supplied into the process chamber 201 are likely to condense and these gases gas may be liquefied. As a result, etching resistance (is also referred to as HF resistance or acid resistance) of the SiOC film formed on the wafer 200 to hydrogen fluoride (HF) or the like may decrease, or in-plane film thickness uniformity or in-plane film quality uniformity of the SiOC film may decrease. When the temperature in the process chamber 201 in the film-forming step is set to 10° C. or more, it is possible to address this problem. When the temperature in the process chamber 201 in the film-forming step is set to room temperature or more, suppression of a condensing reaction of gases supplied into the process chamber 201 becomes easier. As a result, it is possible to increase the etching resistance of the SiOC film formed on the wafer 200 and increase the in-plane film thickness uniformity or in-plane film quality uniformity of the SiOC film. When the temperature in the process chamber 201 in the film-forming step is set to 50° C. or more, a condensing reaction of gases supplied into the process chamber 201 can be reliably avoided. Therefore, it is possible to further increase the etching resistance of the SiOC film formed on the wafer 200 and further increase the in-plane film thickness uniformity or in-plane film quality uniformity of the SiOC film.

Also, when the pressure in the process chamber 201 is set to a predetermined pressure (for example, 1,333 Pa or less) within the above range, if the temperature in the process chamber 201 in the film-forming step is greater than 90° C., a film-forming reaction (a forming reaction of a first layer and a second layer in Step 1 and Step 2, to be described below) on the wafer 200 is less likely to proceed and a thickness of a layer to be formed per cycle may decrease (cycle rate may decrease). As a result, a film-forming rate of the SiOC film may decrease. When the temperature in the process chamber 201 in the film-forming step is set to 90° C. or less, it is possible to address this problem. When the temperature in the process chamber 201 in the film-forming step is set to 70° C. or less, it is possible to reliably ensure (maintain) a practical cycle rate level, that is, a film-forming rate at a practical level.

Therefore, the temperature in the process chamber 201 in the film-forming step (first temperature) is set to a temperature in a range of 10° C. or more and 90° C. or less, preferably room temperature (25° C.) or more and 70° C. or less and more preferably 50° C. or more and 70° C. or less.

When BTCSM gas is supplied to the wafer 200 under the above-described conditions, a silicon-containing layer containing C and Cl having a thickness of, for example, about less than one atomic layer to several atomic layers, is formed on the wafer 200 [a base film of the surface] as a first layer. The silicon-containing layer containing C and Cl becomes a layer including a Si—C bond. The silicon-containing layer containing C and Cl may include either or both of a silicon layer containing C and Cl and an adsorption layer of BTCSM. Also, in this specification, the silicon-containing layer containing C and Cl may be simply called a silicon-containing layer containing C for convenience of description.

The silicon layer containing C and Cl generally refers to a continuous layer that is formed of Si and contains C and Cl, a discontinuous layer, or a Si thin film that is formed by overlapping such layers and contains C and Cl. The continuous layer that is formed of Si and contains C and Cl may also be called a Si thin film containing C and Cl. Si forming the silicon layer containing C and Cl includes Si whose bond with C or Cl is not completely broken and Si whose bond with C or Cl is completely broken.

The adsorption layer of BTCSM includes a continuous adsorption layer formed of BTCSM molecules or a discontinuous adsorption layer. That is, the adsorption layer of BTCSM includes an adsorption layer that is formed of BTCSM molecules and has a thickness of one molecular layer or less than one molecular layer. BTCSM molecules forming the adsorption layer of BTCSM include a molecule represented by a chemical structural formula of FIG. 7A and molecules in which a bond between Si and C is partially broken or a bond between Si and Cl is partially broken. That is, the adsorption layer of BTCSM may include either or both of a physical adsorption layer of BTCSM and a chemical adsorption layer of BTCSM.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer. The silicon-containing layer containing C and Cl may include both the silicon layer containing C and Cl and the adsorption layer of BTCSM. However, as described above, notations such as "one atomic layer" and "several atomic layers" are used for the silicon-containing layer containing C and Cl.

When a thickness of the first layer formed on the wafer 200 is greater than several atomic layers, an oxidizing action in Step 2 (to be described below) does not influence the entire first layer. Also, a minimum thickness of the first layer that can be formed on the wafer 200 is less than one atomic layer. Therefore, the thickness of the first layer is preferably set to about less than one atomic layer to several atomic layers. When the thickness of the first layer is set to one atomic layer or less, that is, one atomic layer or less than one atomic layer, an effect of an oxidizing reaction in Step 2 (to be described below) can relatively increase, thus a time required for the oxidizing reaction in Step 2 can decrease. A time required for forming the first layer in Step 1 can also decrease. As a result, it is possible to decrease a processing time for a cycle and thus a total processing time can also decrease. That is, it is possible to increase the film-forming rate as well. Also, when the thickness of the first layer is set to one atomic layer or less, it is possible to increase controllability of film thickness uniformity.

Under conditions in which BTCSM gas is self-decomposed (pyrolyzed), that is, conditions causing a pyrolysis reaction of BTCSM, when Si is deposited on the wafer 200, the silicon layer containing C and Cl is formed. Under conditions in which BTCSM gas is not self-decomposed (pyrolyzed), that is, conditions that do not cause a pyrolysis reaction of BTCSM, when BTCSM is adsorbed onto the wafer 200, the adsorption layer of BTCSM is formed. Under any condition, at least some Si—C bonds in BTCSM gas are not broken but are preserved (maintained) and directly added into the silicon-containing layer containing C and Cl (the silicon layer containing C and Cl or the adsorption layer of BTCSM). Forming the silicon layer containing C and Cl on the wafer 200 is preferable since a film-forming rate is higher when the silicon layer containing C and Cl is formed on the wafer 200 than when the adsorption layer of BTCSM is formed on the wafer 200. However, in the present embodiment, since the temperature of the wafer 200 is set to a low temperature, for example, 90° C. or less, the adsorption layer of BTCSM is easily formed on the wafer 200 rather than the silicon layer containing C and Cl. Also, when no pyridine gas is supplied in addition to BTCSM gas, the adsorption layer of BTCSM may easily be configured by the physical adsorption layer of BTCSM rather than the chemical adsorption layer of BTCSM.

Pyridine gas serves as a catalytic gas that decreases a binding force of an O—H bond in a surface of the wafer 200, promotes decomposition of BTCSM gas and promotes formation of the first layer by chemical adsorption of BTCSM molecules. For example, pyridine gas acts on the O—H bond on the surface of the wafer 200 and decreases the binding force. When H atoms having a low binding force react with Cl atoms of BTCSM gas, a gas-phase material containing Cl and H is produced, H atoms are desorbed from the surface of the wafer 200 and Cl atoms are desorbed from BTCSM molecules. BTCSM molecules (halides) that have lost Cl atoms are chemisorbed onto the surface of the wafer 200 or the like. Therefore, the chemical adsorption layer of BTCSM is formed on the wafer 200 as the first layer.

N atoms including a lone pair of electrons in a pyridine molecule attract H atoms so that a binding force of the O—H bond in the surface of the wafer 200 decreases due to a catalytic action of pyridine gas. A compound having a high pKa has a strong attractive force for H atoms. When a compound having a pKa of 5 or more is used as a catalytic gas, decomposition of BTCSM is promoted and it is possible to promote formation of the first layer by chemical adsorption. However, when a compound having an excessively high pKa is used as a catalytic gas, Cl atoms extracted from BTCSM molecules react with the catalytic gas and accordingly a salt (a particle source) such as ammonium chloride ($NH_4Cl$) may be produced. Therefore, a compound having a pKa, for example, 11 or less and preferably 7 or less, is preferably used as a catalytic gas. Since pyridine gas has a pKa of about 5.67, that is relatively high and has a pKa of less than 7, it can be preferably used as a catalytic gas.

After the first layer is formed, the valves 243a and 243c are closed to suspend supply of BTCSM gas and pyridine gas into the process chamber 201. In this case, while the APC valve 244 is open, the inside of the process chamber 201 is vacuum-exhausted by the vacuum pump 246 and an unreacted gas remaining in the process chamber 201 or BTCSM gas and pyridine gas that have contributed to formation of the first layer, reaction byproducts and the like are removed from the inside of the process chamber 201. Also, while the valves 243d through 243f are open, supply of $N_2$ gas into the process chamber 201 continues. $N_2$ gas serves as a purge gas. Therefore, it is possible to increase an effectiveness of removing an unreacted gas remaining in the process chamber 201 or BTCSM gas and pyridine gas that have contributed to formation of the first layer and the like from the inside of the process chamber 201.

In this case, a gas remaining in the process chamber 201 may not be completely removed and the inside of the process chamber 201 may not be completely purged. When an amount of the gas remaining in the process chamber 201 is small, there is no negative influence on Step 2 performed thereafter. There is no need to set a flow rate of $N_2$ gas supplied into the process chamber 201 to be high. For example, when the amount of $N_2$ gas the same as the volume of the reaction tube 203 [the process chamber 201] is supplied, it is possible to purge to the extent that there is no negative influence on Step 2. In this manner, by not completely purging the inside of the process chamber 201, the purge time decreases, thereby improving throughput. It is also possible to suppress unnecessary consumption of $N_2$ gas to a minimum.

As the source gas, in addition to BTCSM gas, a silane source gas including a Si—C bond such as BTCSE gas, TCDMDS gas, DCTMDS gas and MCPMDS gas may be used.

As the catalytic gas, in addition to pyridine gas, a cyclic amine-based gas such as an aminopyridine gas, a picoline gas, a lutidine gas, a piperazine gas and a piperidine gas, a chain amine-based gas such as TEA gas, DEA gas, MEA gas, TMA gas and MMA gas and a non-amine-based gas such as $NH_3$ gas may be used.

As the inert gas, in addition to $N_2$ gas, a noble gas such as Ar gas, He gas, Ne gas and Xe gas may be used.

[Step 2]

In this step, $H_2O$ gas and a pyridine gas are supplied to the wafer 200 in the process chamber 201.

Switch control of the valves 243b, 243c and 243d through 243f is performed in the same order as that of the switch control of the valves 243a, 243c and 243d through 243f in Step 1. $H_2O$ gas and pyridine gas whose flow rates are regulated by the MFCs 241b and 241c are supplied into the process chamber 201 through the nozzles 249b and 249c, mixed (post-mix) after being supplied into the process chamber 201 and exhausted through the exhaust pipe 231.

Also, $N_2$ gas for preventing $H_2O$ gas from entering the nozzle 249a is supplied into the process chamber 201 through the gas supply pipe 232a and the nozzle 249a and exhausted through the exhaust pipe 231.

In this case, a supply flow rate of $H_2O$ gas controlled by the MFC 241b is set to, for example, a flow rate in a range of 10 sccm to 10,000 sccm and preferably 100 sccm to 1,000 sccm. A supply flow rate of pyridine gas controlled by the MFC 241c is set to, for example, a flow rate in a range of 1 sccm to 2,000 sccm and preferably 10 sccm to 1,000 sccm. A time for which $H_2O$ gas and pyridine gas are supplied to the wafer 200, that is, a gas supply time (radiation time) is set to, for example, a time in a range of 1 to 100 seconds and preferably 5 to 60 seconds. The other processing conditions may be the same as, for example, the processing conditions of Step 1. Also, it is possible to independently regulate an amount of pyridine gas supplied in Step 2 and an amount of pyridine gas supplied in Step 1. For example, supply amounts of pyridine gas in Step 1 and Step 2 may be the same or different.

Under the above-described conditions, when $H_2O$ gas is supplied to the wafer 200, at least a part of the first layer (the silicon-containing layer containing C and Cl) formed on the wafer 200 in Step 1 is oxidized (modified). When the first layer is modified, a second layer containing Si, O and C, that is, a silicon oxycarbide layer (SiOC layer), is formed. When the second layer is formed, at least some Si—C bonds included in the first layer are not broken but are preserved and directly added (remain in) into the second layer. When the second layer is formed, impurities such as Cl atoms included in the first layer form a gas-phase material containing at least Cl atoms during a modification reaction process by $H_2O$ gas and are discharged from the inside of the process chamber 201. That is, impurities such as Cl atoms in the first layer are extracted or desorbed from the first layer and thus separated from the first layer. Therefore, the second layer becomes a layer having fewer impurities such as Cl atoms than the first layer.

Pyridine gas serves as a catalytic gas (a second catalytic gas) that decreases a binding force of an O—H bond included in $H_2O$ gas, promotes decomposition of $H_2O$ gas and promotes formation of the second layer by a reaction of $H_2O$ gas and the first layer. For example, pyridine gas acts on the O—H bond included in $H_2O$ gas and decreases the binding force. When H atoms having a low binding force react with Cl atoms included in the first layer formed on the wafer 200, a gas-phase material containing Cl and H is produced, H atoms are desorbed from $H_2O$ molecules and Cl atoms are desorbed from the first layer. O atoms of $H_2O$ gas that has lost H atoms bind to Si atoms of the first layer in which Cl atoms are desorbed and at least some C atoms remain. Therefore, an oxidized first layer, that is, a second layer, is formed on the wafer 200.

N atoms including a lone pair of electrons in a pyridine molecule attract H atoms so that a binding force of the O—H bond included in $H_2O$ gas decreases due to a catalytic action of pyridine gas. As described above, a compound having a high pKa has a strong attractive force for H atoms. When a compound having a pKa of 5 or more is used as a catalytic gas, it is possible to appropriately decrease a binding force of the O—H bond included in $H_2O$ gas and it is possible to promote the above-described oxidizing reaction. However, when a compound having an excessively high pKa is used as a catalytic gas, Cl atoms extracted from the first layer react with the catalytic gas and a salt such as $NH_4Cl$ may be produced. Therefore, a compound having a pKa of, for example, 11 or less and preferably 7 or less is preferably used as a catalytic gas. Since pyridine gas has a pKa of about 5.67 that is relatively high and has a pKa of less than 7, it can be preferably used as a catalytic gas. This is the same as in Step 1.

After the second layer is formed, the valves 243b and 243c are closed to suspend supply of $H_2O$ gas and pyridine gas into the process chamber 201. Also, according to the same processing sequence as in Step 1, an unreacted gas remaining in the process chamber 201 or $H_2O$ gas and pyridine gas that have contributed to formation of the second layer, reaction byproducts and the like are removed from the inside of the process chamber 201. In this case, similarly to Step 1, a gas remaining in the process chamber 201 and the like may not be completely removed.

As the reactive gas, in addition to $H_2O$ gas, for example, an oxygen-containing gas including an O—H bond such as hydrogen peroxide ($H_2O_2$) gas may be used. As the reactive gas, an oxygen-containing gas having no O—H bond, for example, oxygen ($O_2$) gas, ozone ($O_3$) gas, a mixed gas of hydrogen ($H_2$) gas and $O_2$ gas, a mixed gas of $H_2$ gas and $O_3$ gas, or the like may be used.

As the catalytic gas, in addition to pyridine gas, for example, the above-described various amine-based gases or non-amine-based gases may be used. That is, as the catalytic gas used in Step 2, a gas having the same molecular structure (chemical structure) as the catalytic gas used in Step 1, that is, a gas of the same material, may be used. Also, as the catalytic gas used in Step 2, a gas having a different molecular structure from the catalytic gas used in Step 1, that is, a gas of a different material may be used.

As an inert gas, in addition to $N_2$ gas, for example, the above-described various types of noble gases may be used.

(Performing a Predetermined Number of Times)

When the cycle including the above-described Step 1 and Step 2 that are performed non-simultaneously, that is, asynchronously and alternately is performed once or more (a predetermined number of times), it is possible to form a SiOC film having a predetermined composition and a predetermined film thickness on the wafer 200. The above-described cycle is preferably repeated a plurality of times. That is, a thickness of the second layer (SiOC layer) to be formed for a cycle is set to be smaller than a desired film thickness and the above-described cycle is preferably repeated a plurality of times until a film thickness of the SiOC film formed by laminating the second layer becomes the desired film thickness.

Also, when the above-described film-forming step is performed, moisture ($H_2O$), reaction byproducts containing moisture or the like may adhere (adsorbed) to the inner wall of the reaction tube 203 or a surface of the boat 217. Also, when the next film-forming step is performed, moisture may be desorbed from the inner wall of the reaction tube 203, the surface of the boat 217, or reaction byproducts adhered thereto. Hereinafter, moisture desorbed from the inner wall of the reaction tube 203 or the surface of the boat 217 or moisture desorbed (to be desorbed) from reaction byproducts adhered to the inner wall of the reaction tube 203 or the surface of the boat 217 is called "moisture desorbed (to be desorbed) from the inner wall of the reaction tube 203" for convenience of description. When the next film-forming step and particularly, Step 1 in which BTCSM gas and pyridine gas are supplied is performed, moisture desorbed from the inner wall of the reaction tube 203 may have an influence on a film-forming rate or film quality of the SiOC film.

For example, when the batch process of forming the SiOC film is repeated according to the above-described film-forming sequence, due to an effect of moisture desorbed from the inner wall of the reaction tube 203, a film-forming rate of the SiOC film may decrease, or film quality thereof may be changed. Moisture desorbed from the inner wall of the reaction tube 203 that inhibits adsorption of BTCSM onto the wafer 200 may be considered as one cause. A hydroxyl group included in moisture desorbed from the inner wall of the reaction tube 203 is highly reactive (is easily adsorbed) and unstable. On the other hand, BTCSM has a high pyrolysis temperature (is hardly decomposed) and has a low reactivity (is hardly adsorbed). When moisture is desorbed from the inner wall of the reaction tube 203 in Step 1 in which BTCSM gas and pyridine gas are supplied, an adsorption site in the surface of the wafer 200, that is, an adsorption site to which BTCSM is adsorbed may be lost due to a hydroxyl group included the desorbed moisture. As a result, chemical adsorption of BTCSM onto the wafer 200, that is, formation of the first layer may be inhibited. Also, when formation of the first layer is inhibited, for example, a thickness of the first layer decreases and a progress of an oxidizing process performed in the second layer is changed. As a result, a composition of the SiOC film to be finally formed, that is, film quality, is gradually changed by repeated batch processing. For example, when the batch process is repeated, an oxygen concentration in a film may increase and a carbon concentration may decrease. Also, etching resistance of the SiOC film may decrease.

Also, as the source gas, when HCDS gas having a lower pyrolysis temperature (that is easily decomposed) and a higher reactivity (that is easily adsorbed) than BTCSM gas is used, an effect of moisture desorbed from the inner wall of the reaction tube 203 is different from that described above.

For example, when a step in which HCDS gas and pyridine gas are supplied to the wafer 200 and a step in which $H_2O$ gas and pyridine gas are supplied to the wafer 200 are performed non-simultaneously, it is possible to form a silicon oxide film (SiO film) on the wafer 200 as a silicon- and oxygen-containing film. When this film-forming step is performed, moisture or reaction byproducts including moisture may be adhered to the inner wall of the reaction tube 203. Also, when the next film-forming step is performed, moisture may be desorbed from the inner wall of the reaction tube 203. When the next film-forming step and particularly Step 1 in which HCDS gas and pyridine gas are supplied is performed, moisture desorbed from the inner wall of the reaction tube 203 may influence a film-forming rate or film quality of the SiO film. That is, when a batch process of forming the SiO film is repeated according to the above-described film-forming sequence, due to an effect of moisture desorbed from the inner wall of the reaction tube 203, a film-forming rate of the SiO film may increase or film quality may be changed. $H_2O$ desorbed from the inner wall of the reaction tube 203 that causes a CVD reaction in the process chamber 201 may be considered as one cause. In the step in which HCDS gas and pyridine gas are supplied, $H_2O$ desorbed from the inner wall of the reaction tube 203 and HCDS supplied into the process chamber 201 cause a gas-phase reaction and therefore, a silicon-containing layer (CVD layer) containing oxygen may be deposited on the wafer 200. A thickness of the CVD layer does not cause a gas-phase reaction and becomes greater than a silicon-containing layer formed on the wafer 200. Therefore, the film-forming rate increases. Also, when the batch process is repeated, an amount of oxygen added to a layer formed in Step 1 may be changed and thus an oxygen concentration in a film may be changed.

The objective described herein is a specific objective for solving problems that arise in a film-forming process in which a gas including a hydroxyl group such as $H_2O$ gas is used and is a new objective that the inventors first discovered through an intensive study.

(Temperature Increasing Step and Temperature Maintaining Step)

In the present embodiment, in order to reach the above-described objectives, after the film-forming step is performed, a temperature increasing step and a temperature maintaining step are sequentially performed. That is, the temperature maintaining step is performed for a predetermined time period after the film-forming step is performed. Therefore, until the next batch process begins, since moisture adhered to the inner wall of the reaction tube 203 or moisture included in reaction byproducts adhered to the inner wall of the reaction tube 203 (hereinafter these are collectively simply called "moisture adhered to the inner wall of the reaction tube 203") can be removed from the inside of the process chamber 201, it is possible to reach the above-described objective.

In the temperature increasing step, an output of the heater 207 is regulated such that the temperature in the process chamber 201 is changed (increased) to the second temperature that is higher than the above-described first temperature. When the temperature in the process chamber 201 becomes the second temperature, the temperature maintaining step starts. In the temperature maintaining step, a temperature of the heater 207 is regulated such that the temperature in the process chamber 201 maintains the second temperature. In this case, power supply for the heater 207 is feedback-controlled based on information on the temperature detected by the temperature sensor 263 such that the inside of the process chamber 201 has a desired temperature distribution and the temperature in the process chamber 201 is constantly maintained.

In the temperature maintaining step, the temperature in the process chamber 201, that is, the second temperature, is set to, for example, a temperature in a range of 100° C. or more and 600° C. or less, preferably 100° C. or more and 300° C. or less and more preferably 100° C. or more and 200° C. or less.

In the temperature maintaining step, when the temperature in the process chamber 201 is less than 100° C., efficiency of removing moisture adhered to the inner wall of the reaction tube 203 from the inside of the process chamber 201 decreases and moisture may be insufficiently removed from the inside of the process chamber 201. When the temperature in the process chamber 201 is set to 100° C. or more, it is possible to promote vaporization of moisture adhered to the inner wall of the reaction tube 203 and thus it is possible to increase efficiency of removing moisture from the inside of the process chamber 201. As a result, it is possible to sufficiently remove moisture from the inside of the process chamber 201.

In the temperature maintaining step, when the temperature in the process chamber 201 is set to a temperature greater than 600° C., much time is consumed waiting in the temperature increasing step or the temperature decreasing step (to be described below) and productivity (throughput) of the substrate process may decrease. In the temperature maintaining step, when the temperature in the process chamber 201 is set to 600° C. or less, it is possible to address this problem. Also, when the temperature in the process chamber 201 is set to 300° C. or less, a waiting time in the temperature increasing step or the temperature decreasing step can sufficiently be decreased and it is possible to sufficiently increase productivity of the substrate process. Also, when the temperature in the process chamber 201 is set to 200° C. or less, a waiting time in the temperature increasing step or the temperature decreasing step can further be decreased and it is possible to increase productivity of the substrate process to the same level of productivity obtained when the temperature increasing step or the temperature maintaining step is not performed. The inventors have confirmed that, when the temperature in the process chamber 201 is set to about 200° C., it is possible to increase efficiency of removing moisture from the inside of the process chamber 201 to a maximum.

Therefore, in the temperature maintaining step, the temperature in the process chamber 201 (the second temperature) may be set to a temperature in a range of 100° C. or more and 600° C. or less, preferably 100° C. or more and 300° C. or less and more preferably 100° C. or more and 200° C. or less.

When the temperature maintaining step starts and then a predetermined time period elapses, while the temperature in the process chamber 201 maintains the second temperature, the unloading step starts. In other words, the temperature maintaining step starts before the unloading step is performed. In the unloading step, the seal cap 219 is lowered by the boat elevator 115 and the lower end of the manifold 209 is opened. The processed wafer 200 is unloaded from the lower end of the manifold 209 to the outside of the reaction tube 203 while being supported by the boat 217 (boat unloading). After boat unloading, the shutter 219s is moved and the lower opening of the manifold 209 is sealed by the shutter 219s with the O-ring 220c in between (shutter close). The processed wafer 200 is unloaded to the outside of the reaction tube 203 and then extracted from the boat 217 (wafer discharge). Also, after wafer discharge, the empty boat 217 may be loaded into the process chamber 201 again.

The temperature maintaining step continues until a predetermined time period elapses after the unloading step is performed. The temperature maintaining step continues before the wafer 200 is unloaded from the inside of the process chamber 201 after the SiOC film is formed until a predetermined time period elapses after the wafer 200 is unloaded from the inside of the process chamber 201. The temperature maintaining step is performed while at least the wafer 200 is not provided in the process chamber 201.

Also, as described above, the temperature increasing step and the temperature maintaining step are performed before the unloading step in which the processed wafer 200 is unloaded to the outside of the process chamber 201 is performed. That is, in the present embodiment, the temperature maintaining step is performed while no wafer 200 is provided in the process chamber 201 as well as while the wafer 200 is in the process chamber 201. Also, when the temperature maintaining step is performed while the wafer 200 is in the process chamber 201, it is possible to modify the SiOC film formed on the wafer 200. That is, when heat treatment is performed on the SiOC film at a higher temperature (the second temperature) than the temperature (first temperature) of the wafer 200 in the film-forming step, it is possible to remove moisture or impurities such as Cl atoms from the SiOC film.

In the temperature increasing step and the temperature maintaining step, the APC valve 244 and the valves 243d through 243f are opened and $N_2$ gas is supplied into the process chamber 201 through the gas supply pipes 232d through 232f and exhausted through the exhaust pipe 231. Therefore, the inside of the process chamber 201 is purged with $N_2$ gas and it is possible to promote removal of moisture from the inside of the process chamber 201.

Also, instead of $N_2$ gas or along with $N_2$ gas, alcohol such as methanol ($CH_3OH$), ethanol ($CH_3CH_2OH$) or isopropyl alcohol [($CH_3$)$_2$CHOH, abbreviated as IPA] may be supplied. Therefore, it is possible to further enhance removal of moisture from the inside of the process chamber 201.

Also, a time period after the unloading step is performed, that is, while no wafer 200 is in the process chamber 201, instead of $N_2$ gas or along with $N_2$ gas, fluorine ($F_2$) gas may be supplied. In this case, it is possible to further enhance removal of moisture from the inside of the process chamber 201. Also, an etching reaction is not caused when $F_2$ gas is supplied into the process chamber 201 at a low temperature and only a reaction that promotes removal of moisture is caused.

When $N_2$ gas, alcohol, or $F_2$ gas is supplied into the process chamber 201, supply of these materials into the process chamber 201 may be intermittently performed. That is, vacuum exhaustion of the inside of the process chamber 201 and purging with $N_2$ gas may be alternately repeated (cycle purge). Also, vacuum exhaustion of the inside of the process chamber 201 and purging with alcohol may be alternately repeated. Also, vacuum exhaustion of the inside of the process chamber 201 and purging with $F_2$ may be alternately repeated. Therefore, it is possible to further promote removal of moisture from the inside of the process chamber 201. After alcohol or $F_2$ gas is supplied into the process chamber 201, $N_2$ gas is supplied into the process chamber 201 and exhausted through the exhaust pipe 231. In this case, a cycle purge may be performed.

Also, before the unloading step is performed, preferably, an opening of the APC valve 244 is regulated to restore the pressure in the process chamber 201 to a normal pressure. Also, during a time period in which the unloading step is performed, the pressure in the process chamber 201 is preferably maintained at a normal pressure. In this manner, it is possible to prevent air from entering the process chamber 201, that is, suppress introduction of moisture included in the air.

Also, in a time period excluding the unloading step, that is, a time period before the unloading step is performed and a time period after the unloading step is performed, the APC valve 244 may be fully open and the inside of the process chamber 201 may be vacuum-exhausted. When the inside of the process chamber 201 is vacuum-exhausted and the pressure in the process chamber 201 is decreased, it is possible to promote vaporization of moisture adhered to the inner wall of the reaction tube 203 and it is possible to further enhance removal of moisture from the inside of the process chamber 201.

Also, in a time period before the unloading step is performed, that is, while the wafer 200 is in the process chamber 201, rotation of the boat 217 and the wafer 200 by the rotating mechanism 267 preferably continues. In this manner, it is possible to uniformly perform the above-described modification process on the SiOC film formed on the wafer 200 over an entire area in the plane of the wafer 200. Also, it is possible to uniformly perform desorption of moisture from the surface of the boat 217 over an entire surface area of the boat 217.

Also, even when the empty boat 217 is loaded into the process chamber 201 in the time period after the unloading step is performed, rotation of the boat 217 by the rotating mechanism 267 preferably continues. In this manner, it is possible to uniformly perform desorption of moisture from the surface of the boat 217 over an entire surface area of the boat 217.

(Temperature Decreasing Step)

When moisture adhered to the inner wall of the reaction tube 203 is completely removed from the inside of the process chamber 201, an output of the heater 207 is regulated such that the temperature in the process chamber 201 is changed to a lower temperature than the second temperature and preferably is changed (decreased) to the first temperature. When decreasing temperature in the process chamber 201 is completed, the above-described batch process, that is, a series of processes from the loading step to the temperature decreasing step is performed again. In this manner, the temperature decreasing step is performed before the wafer 200 to be processed in the next batch process is loaded into the process chamber 201.

(3) Effects of the Present Embodiment

According to the present embodiment, one or a plurality of effects to be described will be obtained.

(a) When the temperature maintaining step is performed in the predetermined time period after the film-forming step is performed, it is possible to remove moisture adhered to the inner wall of the reaction tube 203 from the inside of the process chamber 201. Therefore, it is possible to prevent the film-forming rate from decreasing or film quality from being changed when the batch process is repeatedly performed. That is, even when the gas including a hydroxyl group such as $H_2O$ gas is used for the film-forming process, it is possible to stabilize the film-forming rate or film quality.

(b) When the temperature maintaining step starts before the unloading step is performed, a time for which the inside of the process chamber 201 maintains the second temperature may be ensured to be longer than when the temperature maintaining step starts after the unloading step is performed. Therefore, it is possible to further reliably remove moisture from the inside of the process chamber 201.

Also, the temperature maintaining step is performed while the boat 217 retaining the processed wafer 200 is in the process chamber 201. Therefore, it is possible to further reliably remove moisture from the surface of the boat 217.

Also, the temperature maintaining step is performed while the processed wafer 200 is in the process chamber 201. Therefore, it is possible to perform heat treatment on the SiOC film formed on the wafer 200 and modify the film.

(c) When the temperature increasing step and the temperature maintaining step are performed whenever the batch process is performed, it is possible to further reliably remove moisture adhered to the inner wall of the reaction tube 203 from the inside of the process chamber 201. That is, the film-forming step, the temperature increasing step, the temperature maintaining step and the temperature decreasing step are set as one set that is repeated a plurality of times to make it possible to further reliably avoid having remaining of moisture in the process chamber 201. Therefore, it is possible to further reliably stabilize the film-forming rate or film quality.

(d) When the temperature decreasing step is performed before the wafer 200 to be processed in the next batch process is loaded into the process chamber 201, a time until the temperature of the wafer 200 becomes the first temperature and is stabilized, that is, a waiting time in the temperature and pressure regulating step, can decrease. As a result, the next film-forming step can quickly start and it is possible to increase productivity of the substrate process.

(e) The above-described effects may be similarly obtained when a gas other than BTCSM gas is used as the source gas, a gas other than $H_2O$ gas is used as the reactive gas, or a gas other than pyridine gas is used as the catalytic gas (4) Modifications The sequence of the substrate process in the present embodiment is not limited to the embodiment illustrated in FIG. 5A, but may be changed to modifications to be described below.

(Modification 1)

Figure 5B:
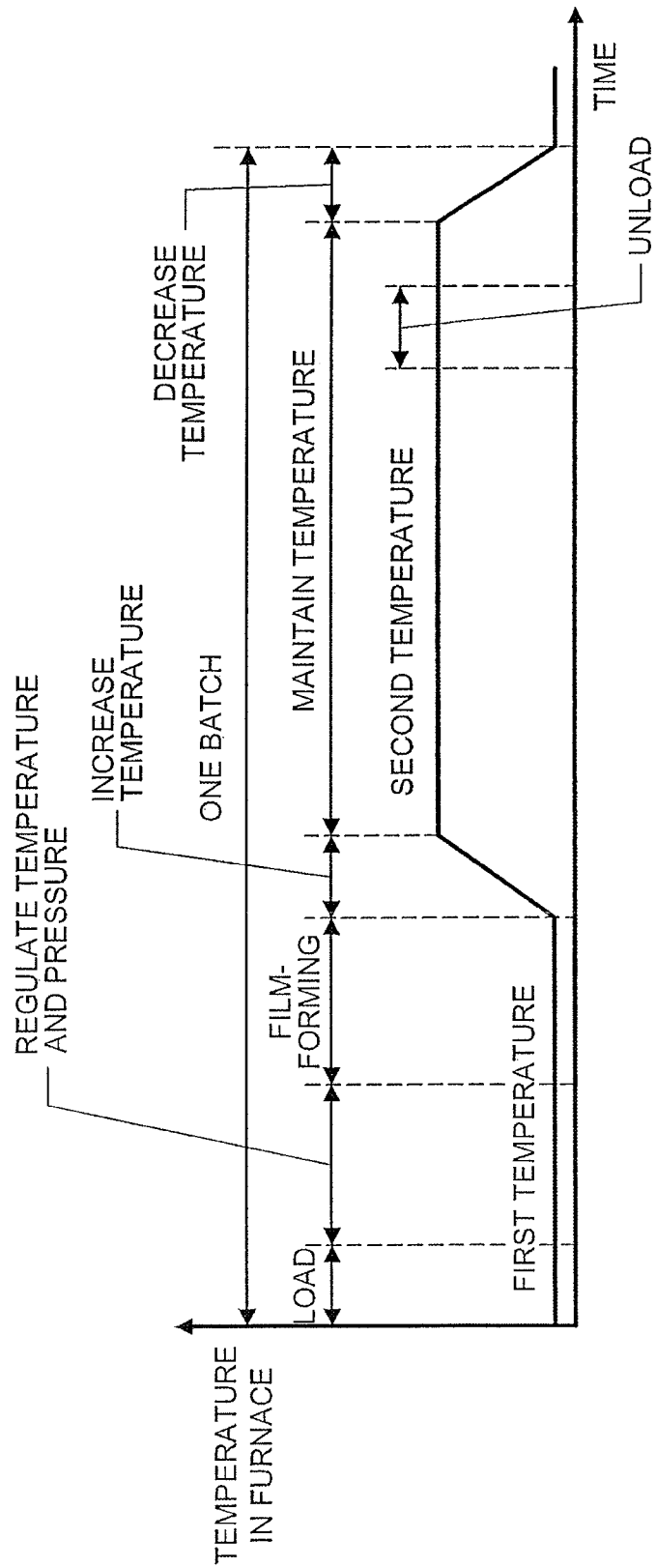
FIG. 5B is a diagram illustrating a modification of a substrate processing sequence of an embodiment of the present invention.

As illustrated in FIG. 5B, the unloading step may be performed in the second half of the temperature maintaining step and preferably performed in the final stage (immediately before the temperature decreasing step starts). In this case, it is possible to obtain the same effects as in the substrate processing sequence illustrated in FIG. 5A. Also, when the unloading step is performed at the above-described timing, it is possible to ensure a longer heat treatment time of the SiOC film formed on the wafer 200 than when the unloading step is performed in the first half of the temperature maintaining step. As a result, it is possible to modify the SiOC film, that is, further reliably remove impurities from the film. Also, it is possible to more reliably remove moisture from the surface of the boat 217.

(Modification 2)

Figure 5C:
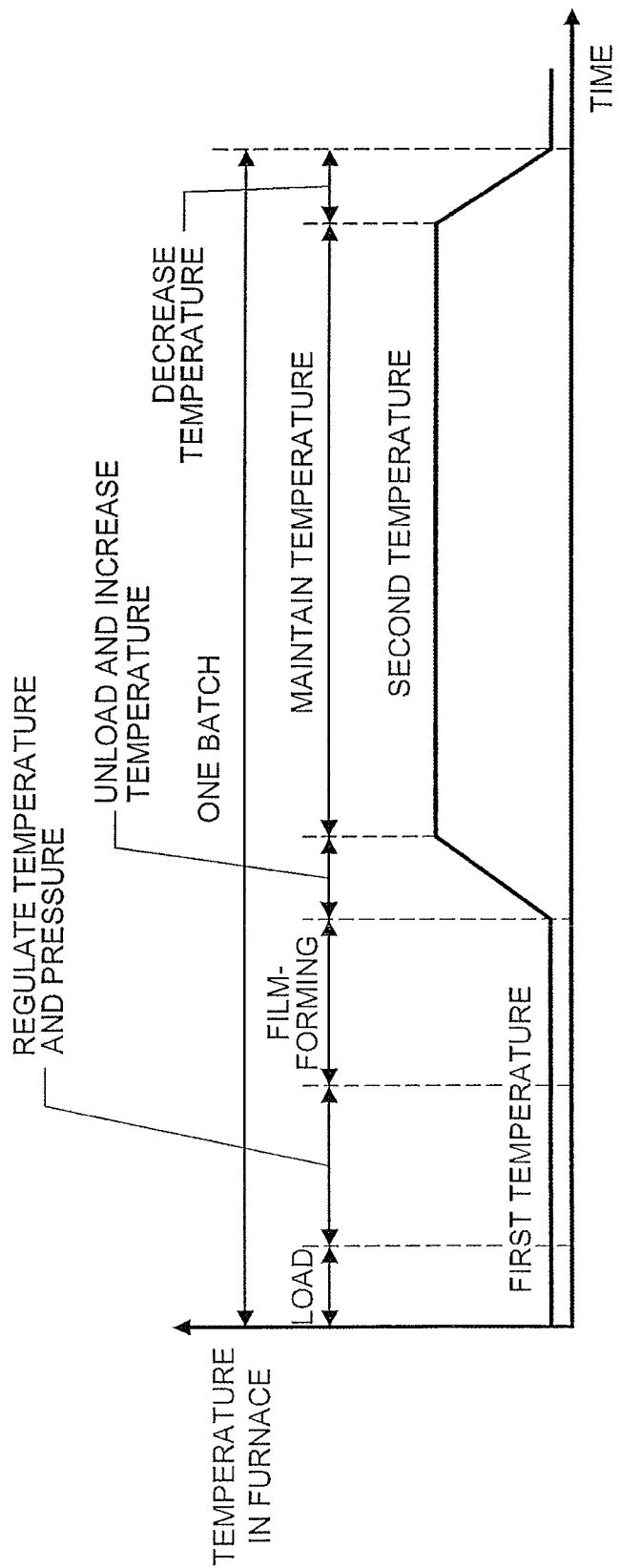
FIG. 5C is a diagram illustrating another modification of a substrate processing sequence of an embodiment of the present invention.

As illustrated in FIG. 5C, the unloading step and the temperature increasing step are simultaneously performed and the temperature maintaining step may be performed after these steps are completed. That is, the temperature maintaining step may start after the unloading step is performed. In this case, it is possible to obtain the same effects as in the substrate processing sequence illustrated in FIG. 5A. Also, when the unloading step is performed at the above-described timing, since the pressure in the process chamber 201 can maintain a reduced pressure in all areas from the initial stage to the final stage of the temperature maintaining step, it is possible to promote vaporization of moisture adhered to the inner wall of the reaction tube 203. As a result, it is possible to further efficiently remove moisture adhered to the inner wall of the reaction tube 203 from the inside of the process chamber 201.

(Modification 3)

Figure 5D:
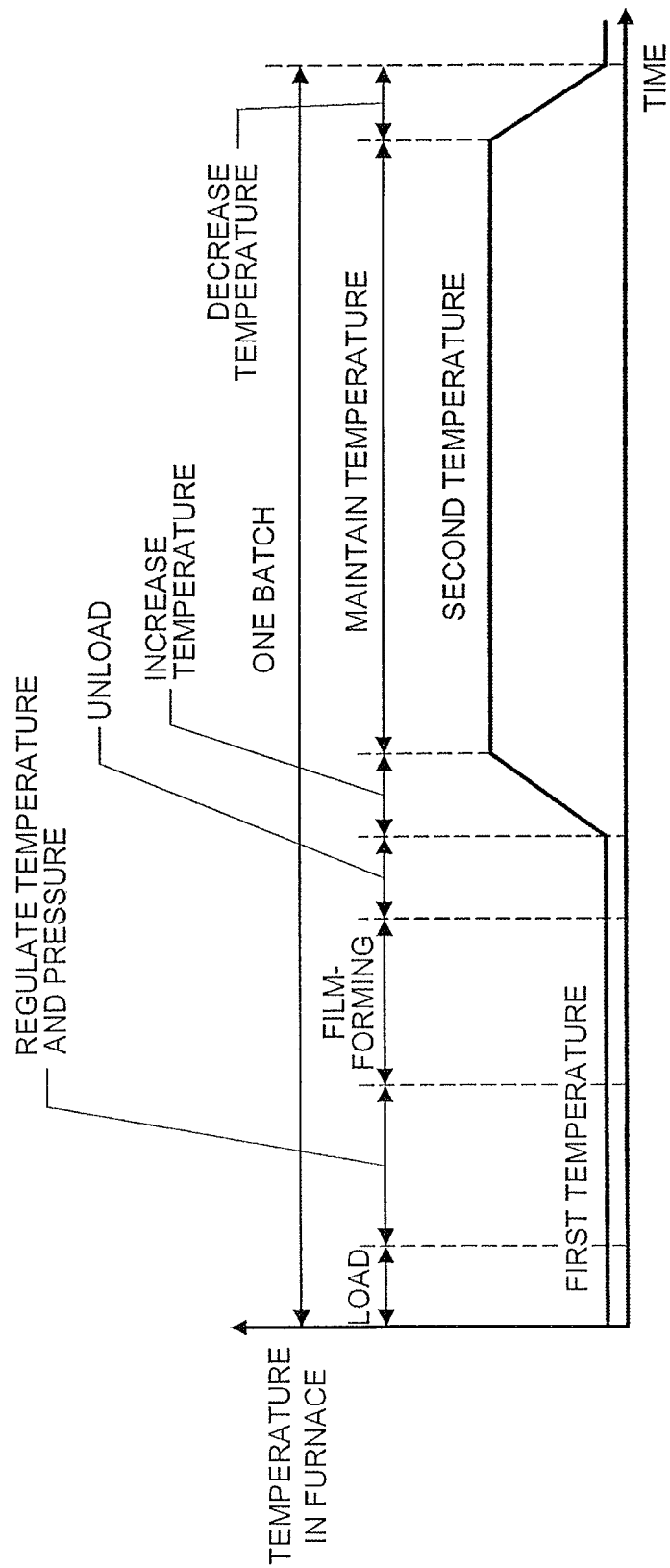
FIG. 5D is a diagram illustrating still another modification of a substrate processing sequence of an embodiment of the present invention.

As illustrated in FIG. 5D, the temperature increasing step and the temperature maintaining step may be performed after the unloading step is performed. That is, the temperature maintaining step may be performed after the unloading step starts and may be performed only while no wafer 200 is in the process chamber 201. In this case, it is possible to obtain the same effects as in the substrate processing sequence illustrated in FIG. 5A. Also, when the unloading step is performed at the above-described timing, since it is possible to decrease an amount of heat applied to the wafer 200 after the film-forming process, it is possible to optimally control thermal history of the wafer 200.

Other Embodiments of the Present Invention

Embodiments of the present invention have been specifically described above. However, the present invention is not limited to the above-described embodiments, but may be variously changed without departing from the scope of the invention.

In the above-described embodiment or the like, the example in which the source gas and the catalytic gas are supplied and then the gas including a hydroxyl group and the catalytic gas are supplied has been described. The present invention is not limited to the example, but the supply order may be reversed. That is, after the gas including a hydroxyl group and the catalytic gas are supplied, the source gas and the catalytic gas may be supplied. When the supply order is changed, it is possible to change film quality or a composition ratio of the film to be formed.

Also, in the above-described embodiment or the like, the example in which, when the first layer is changed to the second layer, the thermally-activated reactive gas is used along with the catalytic gas, that is, the catalytic gas and the reactive gas are supplied in a non-plasma atmosphere has been described. The present invention is not limited to the example, but a reactive gas excited into a plasma may be supplied. That is, the reactive gas may be supplied in a plasma atmosphere. In this case, processing conditions may be the same as, for example, the processing conditions of the above-described embodiment.

Also, in the above-described embodiment or the like, the example in which the chlorosilane source gas is used as the source gas has been described. The present invention is not limited thereto, but a halosilane source gas, for example, a fluorosilane source gas or a bromosilane source gas, may be used in addition to the chlorosilane source gas. In this case, processing conditions may be the same as, for example, the processing conditions of the above-described embodiment.

When a silicon-based insulation film formed by the method of the above-described embodiment is used as a sidewall spacer, it is possible to provide device forming technology having a low leakage current and an excellent processability. Also, when the above-described silicon-based insulation film is used as an etch stopper, it is possible to provide device forming technology having an excellent processability. Also, according to the above-described embodiment, it is possible to form a silicon-based insulation film having an ideal stoichiometric ratio without using plasma. Since the silicon-based insulation film can be formed without using plasma, adaptation to a process in which plasma damage is a concern, for example, an SADP film of DPT, may be possible.

In the above-described embodiment or the like, the example in which the SiOC film is formed on the wafer 200 has been described. The present invention is not limited thereto, but may be preferably applied when a silicon-based oxide film such as a SiO film, a silicon oxycarbonitride film (SiOCN film) and a silicon oxynitride film (SiON film) is formed on the wafer 200.

Also, the present invention may be preferably applied when an oxide film containing germanium (Ge), that is, a germanium-based oxide film, is formed on the wafer 200. That is, the present invention may be preferably applied when a germanium oxycarbide film (GeOC film), a germanium oxide film (GeO film), a germanium oxycarbonitride film (GeOCN film), or a germanium oxynitride film (GeON film) is formed on the wafer 200.

In this manner, the present invention may be preferably applied when a semiconductor oxide film containing a semiconductor element such as Si or Ge, that is, a semiconductor-based oxide film, is formed on the wafer 200.

Also, the present invention may be preferably applied when an oxide film containing a metal element such as titanium (Ti), zirconium (Zr), hafnium (Hf), tantalum (Ta), niobium (Nb), aluminum (Al), molybdenum (Mo) or tungsten (W), that is, a metal-based oxide film, is formed on the wafer 200. That is, the present invention may be preferably applied when a TiOC film, a TiO film, a TiOCN film, a TiON film, a ZrOC film, a ZrO film, a ZrOCN film, a ZrON film, an HfOC film, an HfO film, an HfOCN film, an HfON film, a TaOC film, a TaO film, a TaOCN film, a TaON film, an NbOC film, an NbO film, an NbOCN film, an NbON film, an AlOC film, an AlO film, an AlOCN film, an AlON film, an MoOC film, an MoO film, an MoOCN film, an MoON film, a WOC film, a WO film, a WOCN film, or a WON film is formed on the wafer 200.

The present invention may be preferably applied when a SiO film, a titanium oxide film (TiO film), a hafnium oxide film (HfO film), a zirconium oxide film (ZrO film), or an aluminum oxide film (AlO film) is formed on a substrate according to a film-forming sequence to be described below using, for example, an HCDS gas, titanium tetrachloride (TiCl$_4$) gas, tetrakis(dimethylamino)titanium (Ti[N(CH$_3$)$_2$]$_4$, abbreviated as TDMAT) gas, tetrakis(ethylmethylamino)hafnium (Hf[N(C$_2$H$_5$)(CH$_3$)]$_4$, abbreviated as TEMAH) gas, tetrakis(ethylmethylamino)zirconium (Zr[N(C$_2$H$_5$)(CH$_3$)]$_4$, abbreviated as TEMAZ) gas, trimethylaluminium [Al(CH$_3$)$_3$, abbreviated as TMA] gas or the like as the source gas.

$$(\text{HCDS}+\text{pyridine} \rightarrow \text{H}_2\text{O}+\text{pyridine}) \times n \rightarrow \text{SiO}$$

$$(\text{TiCl}_4 \rightarrow \text{H}_2\text{O}+\text{pyridine}) \times n \rightarrow \text{TiO}$$

$$(\text{TDMAT} \rightarrow \text{H}_2\text{O}) \times n \rightarrow \text{TiO}$$

$$(\text{TEMAH} \rightarrow \text{H}_2\text{O}) \times n \rightarrow \text{HfO}$$

$$(\text{TEMAZ} \rightarrow \text{H}_2\text{O}) \times n \rightarrow \text{ZrO}$$

$$(\text{TMA} \rightarrow \text{H}_2\text{O}) \times n \rightarrow \text{AlO}$$

In this case, processing sequences and processing conditions may be the same as, for example, the processing sequences and processing conditions of the above-described embodiment. In this case, effects same as in those the above-described embodiment or modification may be obtained.

That is, the present invention may be preferably applied when an oxide film containing a semiconductor element or a metal element is formed. That is, the present invention may be generally applied to a film-forming process using a gas including a hydroxyl group.

Preferably, a recipe (a program in which processing sequences, processing conditions and the like are described) used in the substrate process is separately prepared according to process content (a film type, a composition ratio, film quality, a film thickness, processing sequences, processing conditions and the like of a film to be formed) and stored in the memory device 121*c* through telecommunication lines or from the external memory device 123. Also, when the substrate process starts, the CPU 121*a* preferably appropriately selects an appropriate recipe according to process content from among a plurality of recipes stored in the memory device 121*c*. Therefore, it is possible to repeatedly than a film having various film types, composition ratios, film qualities and film thicknesses in the single substrate processing apparatus. Also, it is possible to decrease an operation load (such as a load for inputting processing sequences or processing conditions) of an operator, thereby preventing operation errors and quickly starting the substrate process.

In addition to creating a new process recipe, the above-described process recipe may be prepared by, for example, changing an existing recipe that is previously installed in the substrate processing apparatus. When the recipe is changed, the changed recipe may be installed in the substrate processing apparatus through the telecommunication lines or from the non-transitory computer-readable recording medium recording the recipe. Also, by manipulating the I/O device 122 provided in the existing substrate processing apparatus, the existing recipe that is previously installed in the substrate processing apparatus may be directly changed.

In the above-described embodiment, the example in which a film is formed using the batch-type substrate processing apparatus that processes a plurality of substrates at once has been described. However, the present invention is not limited to the above-described embodiment, but may be preferably applied, for example, when the film is formed using a single substrate processing apparatus that processes one or several substrates at once. Also, in the above-described embodiment, the example in which the film is formed using the substrate processing apparatus including a hot wall-type processing furnace has been described. However, the present invention is not limited to the above-described embodiment, but may be preferably applied when the film is formed using a substrate processing apparatus including a cold wall-type processing furnace.

Figure 11:
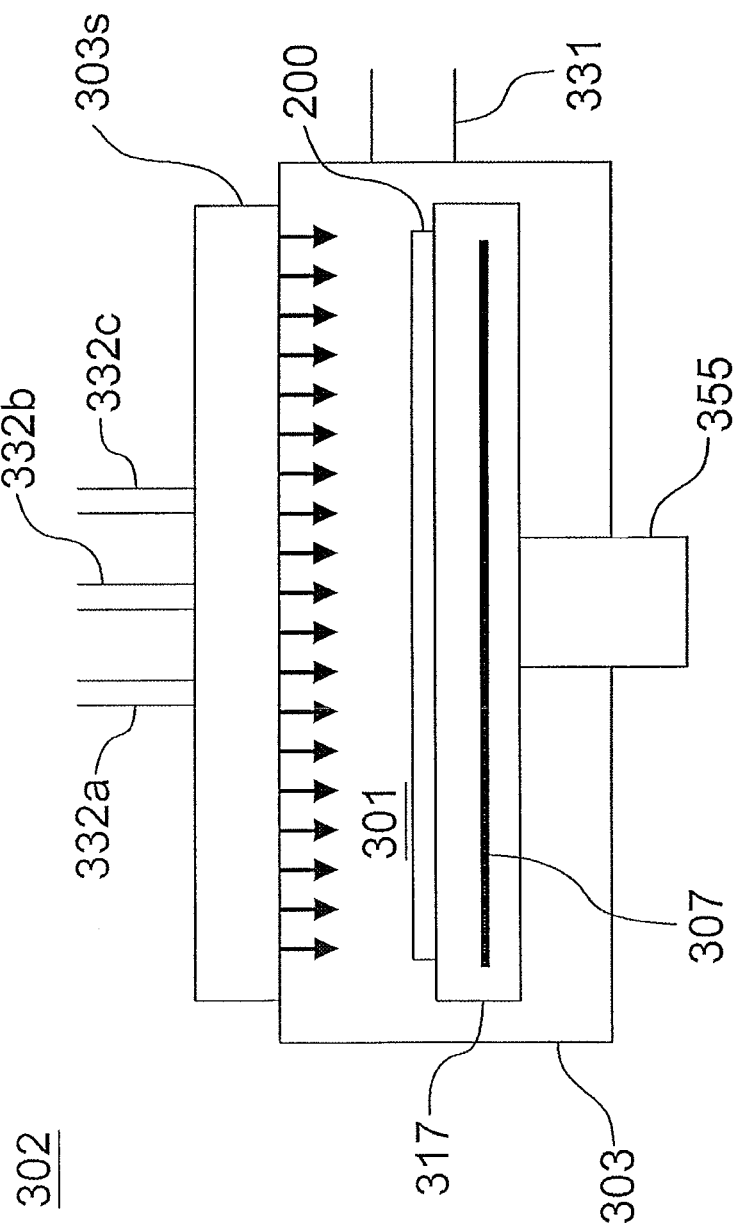
FIG. 11 is a schematic configuration diagram of a processing furnace preferably used in a substrate processing apparatus in another embodiment of the present invention and is a vertical cross-sectional view of the processing furnace portion.

For example, the present invention may be preferably applied when a substrate processing apparatus including a processing furnace 302 illustrated in FIG. 11 is used to form a film. The processing furnace 302 includes a process container 303 forming a process chamber 301, a shower head 303s configured to supply a gas in a shower form into the process chamber 301, a support 317 configured to horizontally support one or a the plurality of wafers 200, a rotating shaft 355 configured to support the support 317 from below and a heater 307 installed in the support 317. In an inlet (gas introduction port) of the shower head 303s, a gas supply port 332a configured to supply the above-described source gas, a gas supply port 332b configured to supply the above-described reactive gas and a gas supply port 332c configured to supply the above-described catalytic gas are connected. In the gas supply port 332a, the same gas supply system as the source gas supply system of the above-described embodiment is connected. In the gas supply port 332b, the same gas supply system as the reactive gas supply system of the above-described embodiment is connected. In the gas supply port 332c, the same gas supply system as the catalytic gas supply system of the above-described embodiment is connected. In an outlet (gas discharge port) of the shower head 303s, a gas distribution plate configured to supply a gas in a shower form into the process chamber 301 is installed. In the process container 303, an exhaust port 331 configured to exhaust the inside of the process chamber 301 is installed. In the exhaust port 331, the same exhaust system as the exhaust system of the above-described embodiment is connected.

Also, for example, the present invention may be preferably applied when a substrate processing apparatus including a processing furnace 402 illustrated in FIG. 12 is used to form a film. The processing furnace 402 includes a process container 403 forming a process chamber 401, a support 417 configured to horizontally support one or a plurality of wafers 200, a rotating shaft 455 configured to support the support 417 from below, a lamp heater 407 configured to emit light to the wafer 200 in the process container 403 and a quartz window 403w configured to transmit light of the lamp heater 407. In the process container 403, a gas supply port 432a configured to supply the above-described source gas, a gas supply port 432b configured to supply the above-described reactive gas and a gas supply port 432c configured to supply the above-described catalytic gas are connected. In the gas supply port 432a, the same gas supply system as the source gas supply system of the above-described embodiment is connected. In the gas supply port 432b, the same gas supply system as the reactive gas supply system of the above-described embodiment is connected. In the gas supply port 432c, the same gas supply system as the catalytic gas supply system of the above-described embodiment is connected. In the process container 403, an exhaust port 431 configured to exhaust the inside of the process chamber 401 is installed. In the exhaust port 431, the same exhaust system as the exhaust system of the above-described embodiment is connected.

When these substrate processing apparatuses are used, the film-forming process may be performed according to the same sequence and processing conditions as in the above-described embodiment.

Also, the above-described embodiments or modifications may be appropriately used in combination. Also, the processing conditions in this case may be the same processing conditions of, for example, the above-described embodiments or modifications.

Example

Experimental results that confirm effects of the above-described embodiments or modifications will be described below.

As an example, the above-described substrate processing apparatus was used and the batch process in which the SiOC film was formed on the wafer according to the film-forming sequence illustrated in FIG. 4 was repeated a plurality of times. In the film-forming step, BTCSM gas was used as the source gas, $H_2O$ gas was used as the gas including a hydroxyl group and pyridine gas was used as the catalytic gas. The first temperature was set to a temperature in a range of 50° C. to 70° C. After the film-forming step was performed, whenever the batch process was repeated, the temperature increasing step, the temperature maintaining step and the temperature decreasing step were performed the in the same sequence as the substrate processing sequence illustrated in FIG. 5A. The second temperature was set to a temperature in a range of 100° C. to 200° C. The other processing conditions were set to conditions in condition ranges described in the above-described embodiment.

As a comparative example, the above-described substrate processing apparatus was used and the batch process in which the SiOC film is formed on the wafer according to the film-forming sequence illustrated in FIG. 4 was repeated a plurality of times. After the film-forming step was performed, the temperature increasing step, the temperature maintaining step and the temperature decreasing step were not performed. Processing conditions were the same as those of the example.

FIG. 10A is a diagram illustrating an evaluation result of film-forming rates of the example and the comparative example. In FIG. 10A, the horizontal axis represents an accumulated film thickness [Å] of the SiOC film formed in each batch process. In FIG. 10A, the vertical axis represents the film-forming rate of the SiOC film in an arbitrary unit [a.u.] based on the film-forming rate in the first batch process. In FIG. 10A, the symbol "○" indicates the SiOC film in the example and the symbol "Δ" indicates the SiOC film in the comparative example. As illustrated in FIG. 10A, it can be understood that, in the comparative example in which neither the temperature increasing step nor the temperature maintaining step was performed when the batch process was repeated, the film-forming rate decreased and was unstable. On the other hand, it can be understood that, in the example in which the temperature increasing step and the temperature maintaining step were performed, even when the batch process was repeated, the film-forming rate was not reduced and it is possible to keep the film-forming rate at a constant value.

Figure 10B:
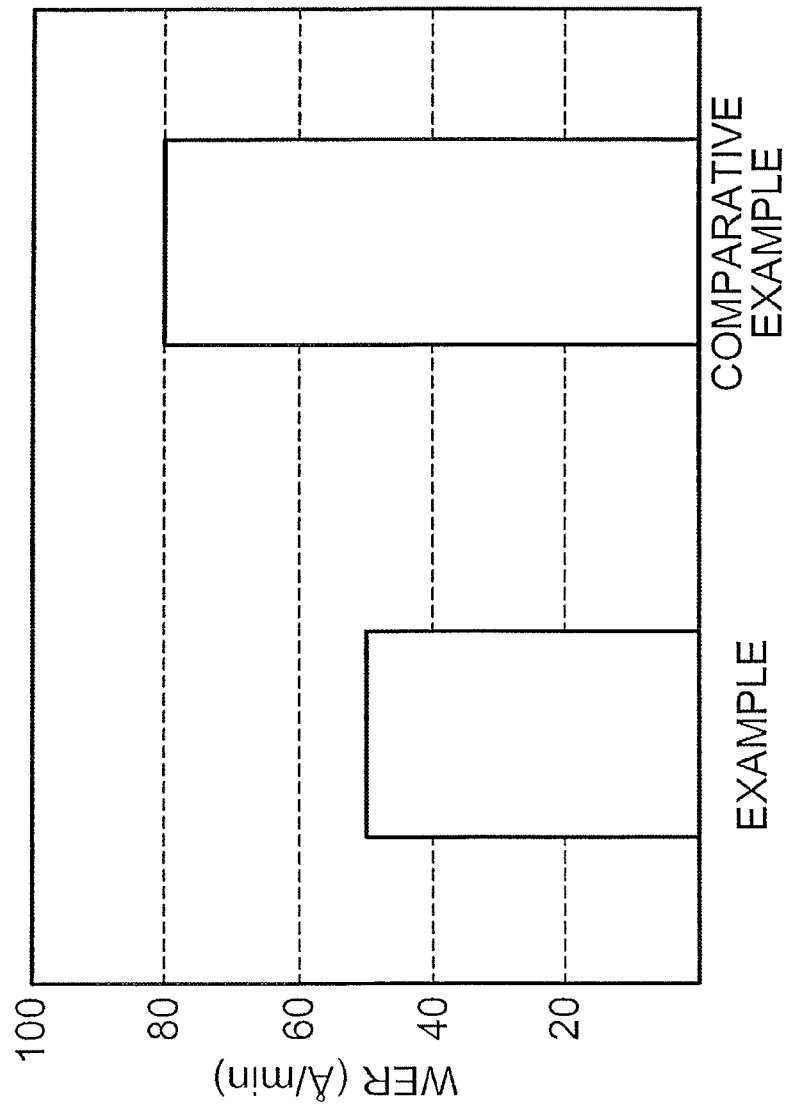
FIG. 10B is a diagram illustrating an evaluation result of etching resistance of a film.

FIG. 10B is a diagram illustrating an evaluation result of etching resistance of the SiOC film that is formed when the batch process is repeated. In FIG. 10B, the vertical axis represents a wet etching rate [Å/min] when an aqueous HF solution (1% concentration) was used to etch the SiOC film. In FIG. 10B, the horizontal axis represents the example and the comparative example. As illustrated, it can be understood that the SiOC film of the example that was formed by performing the temperature increasing step and the temperature maintaining step had a lower wet etching rate, that is, higher etching resistance, than the SiOC film of the comparative example that was formed by performing the temperature increasing step and the temperature maintaining step.

Based on such results, it can be understood that, when the temperature maintaining step is performed for a predetermined time period after the film-forming step is performed, it is possible to stabilize the film-forming rate and form a film having a higher film quality.

According to the present invention, it is possible to stabilize a film-forming rate or film quality when a film is formed on a substrate.

Preferred Embodiments of the Present Invention

Hereinafter, preferred embodiments according to the present invention are supplementarily noted.

<Supplementary Note 1>

According to an aspect of the present invention, there is provided a method of manufacturing a semiconductor device or a substrate processing method, including:

(a) forming a film on a substrate by supplying at least a gas including hydroxyl group to the substrate in a process chamber while maintaining a temperature of an inside of the process chamber at a first temperature;

(b) changing the temperature of the inside of the process chamber from the first temperature to a second temperature higher than the first temperature; and (c) maintaining the temperature of the inside of the process chamber at the second temperature at least in a state that the substrate is not in the process chamber.

<Supplementary Note 2>

In the method of manufacturing the semiconductor device or the substrate processing method of Supplementary note 1, preferably, the step (c) is performed after the step (a) is performed.

<Supplementary Note 3>

In the method of manufacturing the semiconductor device or the substrate processing method of any one of Supplementary notes 1 and 2, preferably, the step (c) is performed with the substrate subjected to the step (a) is loaded in the process chamber. That is, the step (c) is performed with the substrate subjected to the step (a) is loaded in the process chamber and the substrate subjected to the step (a) is unloaded from the process chamber.

<Supplementary Note 4>

In the method of manufacturing the semiconductor device or the substrate processing method of any one of Supplementary notes 1 through 3, preferably, the step (c) starts before the substrate subjected to the step (a) is unloaded from the process chamber.

<Supplementary Note 5>

In the method of manufacturing the semiconductor device or the substrate processing method of Supplementary note 4, preferably, the step (c) is continuously performed even when the substrate subjected to the step (a) is being unloaded from the process chamber. That is, the step (c) is performed before the substrate subjected to the step (a) is unloaded from the process chamber and during the substrate subjected to the step (a) is being unloaded from the process chamber.

<Supplementary Note 6>

In the method of manufacturing the semiconductor device or the substrate processing method of any one of Supplementary notes 4 and 5, preferably, the step (c) is continuously performed even after the substrate subjected to the step (a) is unloaded from the process chamber. That is, the step (c) is continuously performed before the substrate subjected to the step (a) is unloaded from the process chamber and even after the substrate subjected to the step (a) is unloaded from the process chamber.

<Supplementary Note 7>

In the method of manufacturing the semiconductor device or the substrate processing method of any one of Supplementary notes 4 through 6, preferably, the step (c) is continuously performed after the substrate subjected to the step (a) is unloaded from the process chamber until a predetermined time period elapses. That is, the step (c) is continuously performed before the substrate subjected to the step (a) is unloaded from the process chamber and after the substrate subjected to the step (a) is unloaded from the process chamber until a predetermined time period elapses.

<Supplementary Note 8>

In the method of manufacturing the semiconductor device or the substrate processing method of Supplementary note 2, preferably, the step (c) starts after the substrate subjected to the step (a) is unloaded from the process chamber <Supplementary Note 9>

In the method of manufacturing the semiconductor device or the substrate processing method of Supplementary note 8, preferably, the step (c) is continuously performed after the substrate subjected to the step (a) is unloaded from the process chamber until a predetermined time period elapses.

<Supplementary Note 10>

In the method of manufacturing the semiconductor device or the substrate processing method of any one of Supplementary notes 1 through 9, preferably, further including: (d) changing the temperature of the inside of the process chamber from the first temperature to the second temperature. Preferably, the step (d) is performed before a substrate to be processed next is loaded in the process chamber.

<Supplementary Note 11>

In the method of manufacturing the semiconductor device or the substrate processing method of Supplementary note 10, preferably, a set of the steps (a) through (d) are repeated a predetermined times. That is the step (c) is performed whenever the step (a) is performed.

<Supplementary Note 12>

In the method of manufacturing the semiconductor device or the substrate processing method of any one of Supplementary notes 1 through 11, preferably, the first temperature ranges from 10° C. to 90° C., more preferably, from 25° C. (room temperature) to 70° C. and most preferably, from 50° C. to 70° C.

<Supplementary Note 13>

In the method of manufacturing the semiconductor device or the substrate processing method of any one of Supplementary notes 1 through 12, preferably, the second temperature ranges from 100° C. to 600° C., more preferably, from 100° C. to 300° C. and most preferably, from 100° C. to 200° C.

<Supplementary Note 14>

In the method of manufacturing the semiconductor device or the substrate processing method of any one of Supplementary notes 1 through 13, preferably, the at least one gas further includes a source gas. That is, the source gas and the gas containing hydroxyl group is supplied in the step (a). An oxide film is formed as the film in this case.

<Supplementary Note 15>

In the method of manufacturing the semiconductor device or the substrate processing method of any one of Supplementary notes 1 through 14, preferably, the at least one gas further includes a source gas and a catalytic gas. That is, the source gas, the catalytic gas and the gas including hydroxyl group is supplied in the step (a). An oxide film is formed as the film in this case.

<Supplementary Note 16>

In the method of manufacturing the semiconductor device or the substrate processing method of any one of Supplementary notes 1 through 15, preferably, the at least one gas further includes a source gas and a catalytic gas and the film is formed on the substrate by performing a cycle a predetermined times, the cycle including non-simultaneously performing: supplying the source gas and the catalytic gas to the substrate; and supplying the gas including hydroxyl group and the catalytic gas to the substrate. An oxide film is formed as the film in this case.

<Supplementary Note 17>

In the method of manufacturing the semiconductor device or the substrate processing method of any one of Supplementary notes 14 through 16, preferably, the source gas includes a chemical bond between carbon and at least one element selected from a group consisting of a semiconductor element and a metal element. The semiconductor element may include one of silicon (Si), germanium (Ge) and the like. The metal element may include one of a transition metal element selected from a group consisting of titanium (Ti), zirconium (Zr), hafnium (Hf), niobium (Nb), tantalum (Ta), molybdenum (Mo), tungsten (W) and the like and a typical metal element selected from a group consisting of aluminum (Al) and the like. An oxide film doped (added) with carbon, that is, an oxide film containing carbon (an oxycarbide film) is fainted as the film in this case.

<Supplementary Note 18>

In the method of manufacturing the semiconductor device or the substrate processing method of Supplementary note 17, preferably, the source gas further contains halogen group consisting of fluorine (F), chlorine (Cl) and bromine (Br) and iodine (I). Preferably, the halogen group may contain chloro group consisting of chlorine (Cl).

<Supplementary Note 19>

According to another aspect of the present invention, there is provided a substrate processing apparatus including:

a process chamber accommodating a substrate;

a gas supply system configured to supply at least a gas including hydroxyl group to the substrate in the process chamber;

a heater configured to heat an inside of the process chamber; and a control unit configured to control the gas supply system and the heater to: (a) form a film on the substrate by supplying the at least the gas including hydroxyl group to the substrate in the process chamber while maintaining a temperature of the inside of the process chamber at a first temperature; (b) change the temperature of the inside of the process chamber from the first temperature to a second temperature higher than the first temperature; and (c) maintain the temperature of the inside of the process chamber at the second temperature at least in a state that the substrate is not in the process chamber.

<Supplementary Note 20>

According to still another aspect of the present invention, there is provided a program or a non-transitory computer-readable recording medium storing a program for causing a computer to control a substrate processing apparatus to perform:

(a) forming a film on a substrate by supplying a gas including hydroxyl group to the substrate in a process chamber while maintaining a temperature of the inside of the process chamber at a first temperature;

(b) changing the temperature of the inside of the process chamber from the first temperature to a second temperature higher than the first temperature; and (c) maintaining the temperature of the inside of the process chamber at the second temperature at least in a state that the substrate is not in the process chamber.

What is claimed is:

1. A method of manufacturing a semiconductor device, comprising:
   (a) forming a film on a substrate by supplying at least a gas including hydroxyl group to the substrate in a process container while maintaining temperatures of an inside and an inner wall of the process container at a first temperature;
   (b) changing the temperatures of the inside and the inner wall of the process container from the first temperature to a second temperature higher than the first temperature;
   (c) maintaining the temperatures of the inside and the inner wall of the process container at the second temperature while supplying into and exhausting from the process container an inert gas, an alcohol or both of the inert gas and the alcohol; and
   (d) unloading the substrate, having been subjected to (a), from the process container while performing (c),
   wherein (c) is continuously performed until a predetermined time period elapses after the substrate subjected to (a) is unloaded from the process container.

2. The method of claim 1, wherein (c) is performed in a predetermined time period after (a) is performed.

3. The method of claim 1, wherein a portion of (c) is performed with the substrate loaded in the process container.

4. The method of claim 1, wherein (c) starts before the substrate subjected to (a) is unloaded from the process container.

5. The method of claim 4, wherein (c) is continuously performed even when the substrate subjected to (a) is being unloaded from the process container.

6. The method of claim 4, wherein (c) is continuously performed even after the substrate subjected to (a) is unloaded from the process container.

7. The method of claim 1, further comprising: (e) changing the temperatures of the inside and the inner wall of the process container from the second temperature to the first temperature.

8. The method of claim 7, wherein a set is repeated a plurality of times, the set including (a), (b), (c), and (e).

9. The method of claim 1, wherein the first temperature ranges from 10° C. to 90° C.

10. The method of claim 1, wherein the second temperature ranges from 100° C. to 600° C.

11. The method of claim 1, wherein a source gas and the gas including hydroxyl group are supplied to the substrate in (a).

12. The method of claim 11, wherein the source gas includes a chemical bond between carbon and at least one element selected from a group consisting of a semiconductor element and a metal element.

13. The method of claim 12, wherein the source gas further includes a halogen group.

14. The method of claim 1, wherein a source gas, the gas including hydroxyl group and a catalytic gas are supplied to the substrate in (a).

15. The method of claim 14, wherein a cycle is performed a predetermined times, the cycle including non-simultaneously performing: supplying the source gas and the catalytic gas to the substrate; and supplying the gas including hydroxyl group and the catalytic gas to the substrate.

16. The method of claim 1, wherein the second temperature is in a temperature range of 100° C. to 300° C.

17. The method of claim 1, wherein the second temperature is in a temperature range of 100° C. to 200° C.

18. A non-transitory computer-readable recording medium comprising instructions for causing a computer to perform a method of manufacturing a semiconductor device, the instructions comprising:
(a) forming a film on a substrate by supplying at least a gas including hydroxyl group to the substrate in a process container while maintaining temperatures of an inside and an inner wall of the process container at a first temperature;
(b) changing the temperatures of the inside and the inner wall of the process container from the first temperature to a second temperature higher than the first temperature;
(c) maintaining the temperatures of the inside and the inner wall of the process container at the second temperature while supplying into and exhausting from the process container and inert gas, an alcohol or both of the inert gas and the alcohol; and
(d) unloading the substrate, having been subjected to (a) from the process container while performing (c),
wherein (c) is continuously performed until a predetermined time period elapses after the substrate subjected to (a) is unloaded from the process container.

* * * * *